(12) United States Patent
Chen et al.

(10) Patent No.: US 12,191,365 B2
(45) Date of Patent: Jan. 7, 2025

(54) THICKER CORNER OF A GATE DIELECTRIC STRUCTURE AROUND A RECESSED GATE ELECTRODE FOR AN MV DEVICE

(71) Applicant: Taiwan Semiconductor Manufacturing Company, Ltd., Hsinchu (TW)

(72) Inventors: Yi-Huan Chen, Hsin Chu (TW); Kong-Beng Thei, Pao-Shan Village (TW); Chien-Chih Chou, New Taipei (TW); Alexander Kalnitsky, San Francisco, CA (US); Szu-Hsien Liu, Zhubei (TW); Huan-Chih Yuan, Zhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/355,549

(22) Filed: Jul. 20, 2023

(65) Prior Publication Data

US 2023/0361188 A1    Nov. 9, 2023

Related U.S. Application Data

(63) Continuation of application No. 17/874,471, filed on Jul. 27, 2022, now Pat. No. 11,799,007, which is a
(Continued)

(51) Int. Cl.
*H01L 29/423*    (2006.01)
*H01L 21/762*    (2006.01)
(Continued)

(52) U.S. Cl.
CPC .. *H01L 29/42368* (2013.01); *H01L 21/76224* (2013.01); *H01L 21/823462* (2013.01);
(Continued)

(58) Field of Classification Search
CPC ........... H01L 29/42368; H01L 29/4236; H01L 29/7813; H01L 29/7825; H01L 29/7834; H01L 21/76224; H01L 21/823462
See application file for complete search history.

(56) References Cited

U.S. PATENT DOCUMENTS 5,314,834 A    5/1994  Mazure et al.
6,136,674 A    10/2000 An et al.
(Continued)

FOREIGN PATENT DOCUMENTS

CN    101281871 A    10/2008
CN    109256425 A    1/2019
(Continued)

OTHER PUBLICATIONS

Ytterdal et al. "Device Modeling for Analog and RF CMOS Circuit Design." Chapter 1: MOSFET Device Physics and Operation. John Wiley & Sons, Ltd ISBN: 0-471-49869-6, published in 2003.
(Continued)

*Primary Examiner* — Joseph C. Nicely
(74) *Attorney, Agent, or Firm* — Eschweiler & Potashnik, LLC

(57) ABSTRACT

In some embodiments, the present disclosure relates to a semiconductor device that includes a well region with a substrate. A source region and a drain region are arranged within the substrate on opposite sides of the well region. A gate electrode is arranged over the well region, has a bottom surface arranged below a topmost surface of the substrate, and extends between the source and drain regions. A trench isolation structure surrounds the source region, the drain
(Continued)

region, and the gate electrode. A gate dielectric structure separates the gate electrode from the well region, the source, region, the drain region, and the trench isolation structure. The gate electrode structure has a central portion and a corner portion. The central portion has a first thickness, and the corner portion has a second thickness that is greater than the first thickness.

20 Claims, 25 Drawing Sheets

Related U.S. Application Data continuation of application No. 17/098,867, filed on Nov. 16, 2020, now Pat. No. 11,469,307.

(60) Provisional application No. 63/084,682, filed on Sep. 29, 2020.

(51) Int. Cl.
*H01L 21/8234* (2006.01)
*H01L 29/40* (2006.01)
*H01L 29/78* (2006.01)

(52) U.S. Cl.
CPC ........ *H01L 29/401* (2013.01); *H01L 29/4236* (2013.01); *H01L 29/7813* (2013.01); *H01L 29/7825* (2013.01); *H01L 29/7834* (2013.01)

(56) References Cited

U.S. PATENT DOCUMENTS

| | | | |
|---|---|---|---|
| 6,225,669 B1 | 5/2001 | Long et al. | |
| 10,276,679 B2 | 4/2019 | Chiu et al. | |
| 2002/0048970 A1 | 4/2002 | Feudel et al. | |
| 2002/0142529 A1 | 10/2002 | Matsuda et al. | |
| 2008/0026519 A1 | 1/2008 | Liu et al. | |
| 2009/0072306 A1* | 3/2009 | Izumi ................ | H01L 29/4236 438/270 |
| 2009/0166736 A1 | 7/2009 | Park | |
| 2010/0102382 A1 | 4/2010 | Shimada et al. | |
| 2010/0173444 A1 | 7/2010 | Mishima et al. | |
| 2010/0207204 A1 | 8/2010 | Kim et al. | |
| 2010/0327345 A1* | 12/2010 | Kawaguchi ....... | H01L 29/66621 257/330 |
| 2011/0220995 A1 | 9/2011 | Chou et al. | |
| 2014/0048874 A1 | 2/2014 | Zhang et al. | |
| 2014/0159142 A1 | 6/2014 | Lim et al. | |
| 2015/0061011 A1 | 3/2015 | Cheng et al. | |
| 2016/0043193 A1 | 2/2016 | Yu et al. | |
| 2016/0064490 A1* | 3/2016 | Hiratsuka ......... | H01L 29/66068 257/77 |
| 2016/0190269 A1 | 6/2016 | Brown et al. | |
| 2016/0276476 A1 | 9/2016 | Fang | |
| 2017/0170281 A1* | 6/2017 | Hiratsuka ........... | H01L 21/3065 |
| 2018/0025910 A1 | 1/2018 | Ohashi et al. | |
| 2018/0175192 A1 | 6/2018 | Fujii et al. | |
| 2018/0248033 A1 | 8/2018 | Izumi | |
| 2019/0259839 A1 | 8/2019 | Ryu | |
| 2019/0334000 A1 | 10/2019 | Zundel et al. | |
| 2019/0393337 A1 | 12/2019 | Izumi | |
| 2021/0066466 A1 | 3/2021 | Kwon et al. | |
| 2021/0202708 A1 | 7/2021 | Cheng et al. | |
| 2022/0320306 A1 | 10/2022 | Banzhaf et al. | |

FOREIGN PATENT DOCUMENTS

| | | |
|---|---|---|
| EP | 1227513 A2 | 7/2002 |
| KR | 101467703 B1 | 12/2014 |

OTHER PUBLICATIONS

Non-Final Office Action dated Dec. 1, 2021 for U.S. Appl. No. 17/098,867.
Final Office Action dated Mar. 25, 2022 for U.S. Appl. No. 17/098,867.
Notice of Allowance dated Jun. 8, 2022 for U.S. Appl. No. 17/098,867.
Non-Final Office Action dated Feb. 16, 2023 for U.S. Appl. No. 17/874,471.
Notice of Allowance dated Jun. 22, 2023 for U.S. Appl. No. 17/874,471.

* cited by examiner

THICKER CORNER OF A GATE DIELECTRIC STRUCTURE AROUND A RECESSED GATE ELECTRODE FOR AN MV DEVICE

REFERENCE TO RELATED APPLICATIONS

This Application is a Continuation of U.S. application Ser. No. 17/874,471, filed on Jul. 27, 2022, which is a Continuation of U.S. application Ser. No. 17/098,867, filed on Nov. 16, 2020 (now U.S. Pat. No. 11,469,307, issued on Oct. 11, 2022), which claims the benefit of U.S. Provisional Application No. 63/084,682, filed on Sep. 29, 2020. The contents of the above-referenced Patent Applications are hereby incorporated by reference in their entirety.

BACKGROUND

Many electronic devices contain a multitude of metal oxide semiconductor field-effect transistors (MOSFETs). A MOSFET includes a gate arranged between a source and a drain. MOSFETs may be categorized as high voltage (HV), medium voltage (MV) or low voltage (LV) devices, depending on the magnitude of the voltage applied to the gate to turn the MOSFET on. The structural design parameters of each MOSFET in an electronic device vary depending on the desired electrical properties.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
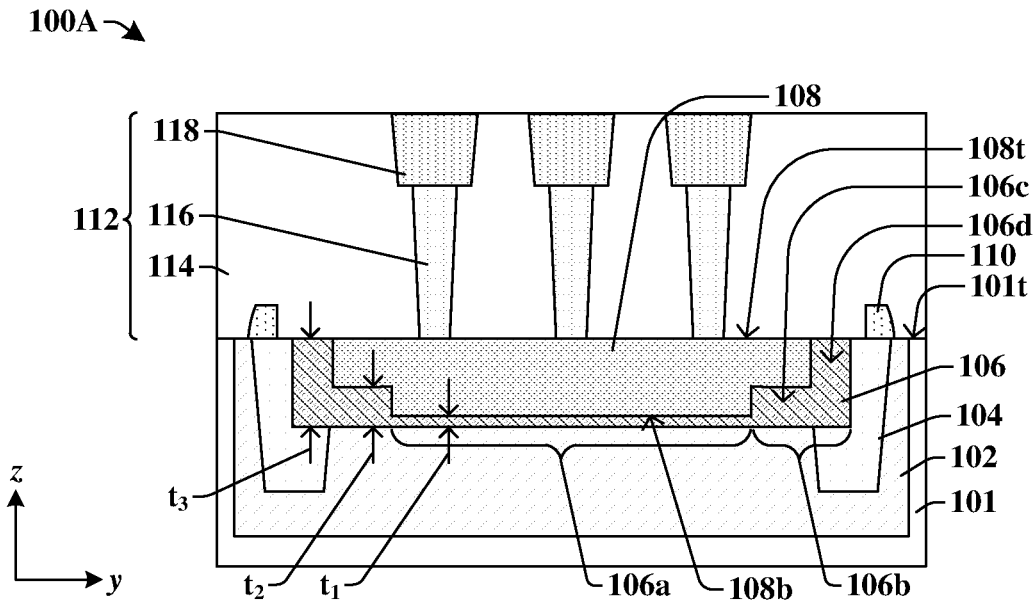
FIGS. 1A and 1B illustrate cross-sectional views of some embodiments of a recessed metal oxide semiconductor field-effect transistor (MOSFET) comprising a gate dielectric structure with a corner portion that is thicker than a central portion.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A metal oxide semiconductor field-effect transistor (MOSFET) comprises a gate electrode arranged between a source region and a drain region on a substrate. Further, a gate dielectric layer may be arranged between the gate electrode and the substrate. In a medium voltage (MV) device, the gate dielectric layer is thicker in order to withstand higher voltages without breaking down compared to a low voltage (LV) device. However, the thicker gate dielectric layer may increase the overall height of the MV device compared to the LV device. Thus, some MV devices may utilize a recessed MOSFET, wherein the gate dielectric layer and the gate electrode are recessed below a topmost surface of the substrate and directly between the source region and the drain region in a lateral direction.

Although the recessed MOSFET reduces the height of the MV device, reliability of a recessed MOSFET may be affected. For example, as the gate voltage applied to the gate electrode is increased, the increase in current through the recessed MOSFET may not have a substantially constant slope as voltage is increased. In some instances, the inconsistencies in the current vs. voltage behavior is due to the gate dielectric layer being thinner near lower corners of the gate electrode recessed below the substrate, causing the threshold voltages to be different at different areas of the gate electrode.

Various embodiments of the present disclosure relate to forming a gate dielectric structure having an outer portion with thicker corners surrounding a gate electrode in a recessed MOSFET in order to improve the predictability, controllability, and reliability of the overall recessed MOSFET. In such embodiments, the thicker corners of the gate dielectric structure may be arranged at areas of the gate dielectric structure that directly contact a trench isolation structure and that are arranged at corners of the source and drain regions. The trench isolation structure may continuously surround the recessed MOSFET and the gate electrode may extend from a first side of the trench isolation structure to a second side of the trench isolation structure. In some embodiments, to increase the thickness of the corners of the gate dielectric structure, a second gate dielectric layer over a first gate dielectric layer are formed within a recess of a substrate. Then, central portions of the first and second gate dielectric layers are removed by way of photolithography and removal processes, such that remaining portions of the first and second gate dielectric layers directly overlie the trench isolation structure. In some embodiments, a third dielectric layer is then formed over the second dielectric layer and the substrate. This way, a majority of the gate dielectric structure has a first thickness of the third dielectric layer, whereas corner portions of the gate dielectric structure have a second thickness equal to a sum of the thicknesses of the first, second, and third gate dielectric layers. The corner portions of the gate dielectric structure may prevent undesired current flow in the substrate underlying the corner portions. With an increased thickness at the corner portions of the gate dielectric structure that overlie the trench isolation structure, the reliability of the recessed MOSFET is increased.

FIG. 1A illustrates a cross-sectional view 100A of some embodiments of an integrated chip comprising a recessed metal oxide semiconductor field effect transistor (MOSFET) having a gate dielectric structure with thicker corner portions.

The cross-sectional view 100A of FIG. 1A may be taken from a yz-plane of a recessed MOSFET, whereas source and drain regions of the recessed MOSFET may be visible from an xz-plane (see, FIG. 3) that is perpendicular to the yz-plane. The cross-sectional view 100A of FIG. 1A includes a substrate 101. In some embodiments, the substrate 101 may be or comprise a semiconductor material (e.g., silicon, germanium, etc.), may be a silicon-on-insulator (SOI) substrate, or some other suitable substrate. In some embodiments, the substrate 101 comprises a well region 102. The well region 102 may have a higher doping concentration and/or a different doping type than the substrate 101. For example, in some embodiments, the substrate 101 may be undoped, whereas the well region 102 may have a first doping type (e.g., p-type) or a second doping type (e.g., n-type).

In some embodiments, a trench isolation structure 104 is disposed within the substrate 101 and surrounds an area of the well region 102 and/or the substrate 101. In some embodiments, the trench isolation structure 104 is a shallow trench isolation (STI) structure such that the trench isolation structure 104 extends into the substrate 101 to a depth between a frontside and backside of the substrate 101. In other embodiments, the trench isolation structure 104 may be a full or deep trench isolation structure such that the trench isolation structure 104 extends entirely or almost entirely through the thickness of the substrate 101. In some embodiments, the trench isolation structure 104 comprises a dielectric material, such as, for example, silicon dioxide, and prevents signals (e.g., current, voltage) of the recessed MOSFET from interfering with other devices arranged on the substrate 101 outside of the area of the well region 102 surrounded by the trench isolation structure 104.

In some embodiments, a gate electrode 108 is arranged within the substrate 101. In some embodiments, the gate electrode 108 extends from a first side of the trench isolation structure 104 to a second side of the trench isolation structure 104 in the y-direction. In some embodiments, a spacer structure 110 may be arranged over the substrate 101. In some embodiments, the spacer structure 110 is primarily used during the formation of the gate electrode 108 and/or other features of the recessed MOSFET. In some embodiments, an interconnect structure 112 is arranged over the substrate 101. In some embodiments, the interconnect structure 112 comprises contact vias 116 and interconnect wires 118 within an interconnect dielectric structure 114. The interconnect structure 112 may provide conductive pathways between the gate electrode 108 and other devices of the integrated chip.

In some embodiments, the gate electrode 108 has a topmost surface 108$t$ that is about planar with a topmost surface 101$t$ of the substrate 101. Thus, a bottommost surface 108$b$ of the gate electrode 108 is arranged below the topmost surface 101$t$ of the substrate 101. Because the gate electrode 108 is recessed below the substrate 101, the overall height of the recessed MOSFET may be reduced.

In some embodiments, a gate dielectric structure 106 is arranged on outer and lower surfaces of the gate electrode 108. The gate dielectric structure 106 may comprise a central portion 106$a$ that covers the bottommost surface 108$b$ of the gate electrode 108 and a corner portion 106$b$ surrounding the central portion 106$a$ and arranged on lower surfaces and outer sidewalls of the gate electrode 108. In some embodiments, the corner portion 106$b$ of the gate dielectric structure 106 directly contacts the trench isolation structure 104 as well as a portion of the well region 102 of the substrate 101. In some embodiments, the corner portion 106$b$ of the gate dielectric structure 106 further comprises an inner corner portion 106$c$ and an outer corner portion 106$d$. In such embodiments, the inner corner portion 106$c$ may couple the central portion 106$a$ to the outer corner portion 106$d$ of the gate dielectric structure 106.

In some embodiments, the central portion 106$a$ of the gate dielectric structure 106 has a first thickness $t_1$; the inner corner portion 106$c$ of the gate dielectric structure 106 has a second thickness $t_2$ that is greater than the first thickness $t_1$; and the outer corner portion 106$d$ of the gate dielectric structure 106 has a third thickness $t_3$ that is about equal to or greater than the second thickness $t_2$. In such embodiments, the first, second, and third thicknesses $t_1$, $t_2$, $t_3$ are all measured in the z-direction and are measured from a bottommost surface of the gate dielectric structure 106. In some embodiments, the corner portion 106$b$ of the gate dielectric structure 106 may comprise three gate dielectric layers, whereas the central portion 106$a$ of the gate dielectric structure 106 may comprise one gate dielectric layer. In some embodiments, the gate dielectric layers that make up the gate dielectric structure 106 comprise a same or similar material (e.g., an oxide), and thus, distinguishing the individual gate dielectric layers of the gate dielectric structure 106 may be difficult in the cross-sectional view 100A In some embodiments, the corner portion 106$b$ has a greater thickness(es) than the central portion 106$a$ of the gate dielectric structure 106 to ensure that the recessed MOSFET has a gate dielectric structure 106 with a thick enough corner portion 106$b$ to reduce undesired current flow in the substrate 101, thereby increasing the predictability and reliability of the recessed MOSFET.

Figure 1B:
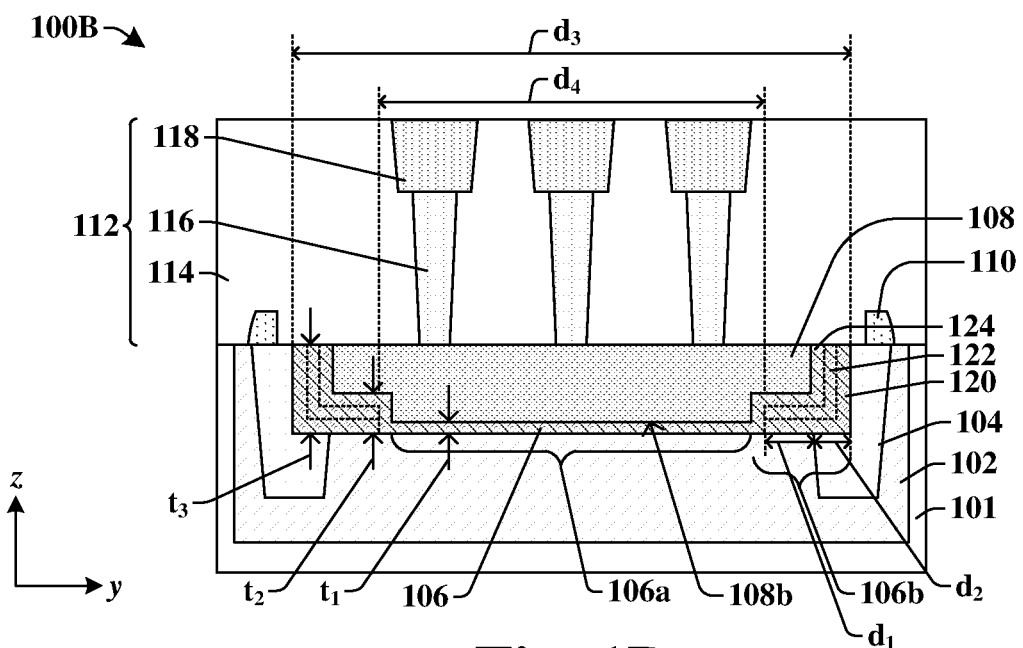

FIG. 1B illustrates a cross-sectional view 100B of an alternative embodiment of the cross-sectional view 100A of FIG. 1A, wherein layers of the gate electrode structure are shown.

The gate dielectric structure 106 of FIG. 1B comprises a first gate dielectric layer 120, a second gate dielectric layer 122 arranged over the first gate dielectric layer 120, and a third gate dielectric layer 124. In some embodiments, the first, second, and third gate dielectric layers 120, 122, 124 comprise the same or similar materials, and thus, in FIG. 1B interfaces between the first, second, and third gate dielectric layers 120, 122, 124 are illustrated with dotted lines. In some embodiments the second gate dielectric layer 122 comprises a high-temperature oxide material. In some embodiments, the corner portion 106b of the gate dielectric structure 106 comprises the first, second, and third gate dielectric layers 120, 122, 124, whereas the central portion 106a of the gate dielectric structure 106 comprises the third gate dielectric layer 124 and not the first and second gate dielectric layers 122, 124. Thus, in some embodiments, the first thickness $t_1$ is equal to a thickness of the third gate dielectric layer 124. In some embodiments, the addition of the first and second gate dielectric layers 122, 124 increases a thickness of the gate dielectric structure 106 at the corner portion 106b of the gate dielectric structure 106.

In some embodiments, a sum of the thickness of the first and second gate dielectric layers 120, 122 is equal to a difference between the first and second thicknesses $t_1$, $t_2$. In some embodiments, a ratio between the difference of the first and second thicknesses $t_1$, $t_2$ and the first thickness $t_1$ is in a range of between, for example, approximately 1.5 and approximately 3. In some embodiments, a ratio between the difference of the first and second thicknesses $t_1$, $t_2$ and the third thickness $t_3$ is in a range of between, for example, approximately 0.25 and approximately 0.33. In some embodiments, a ratio between the first thickness $t_1$ and the third thickness $t_3$ is in a range of between, for example, approximately 0.125 and approximately 0.18. In some embodiments, a ratio between the second thickness $t_2$ and the third thickness $t_3$ is in a range of between, for example, approximately 0.5 and approximately 1.

In some embodiments, the first and second gate dielectric layers 120, 122 of the corner portion 106b of the gate dielectric structure 106 extends from the trench isolation structure 104 to a first distance $d_1$ directly on the well region 102. In some embodiments, the first distance $d_1$ may be in a range of between, for example, approximately 0.1 micrometers and approximately 0.3 micrometers. In some embodiments, the first and second gate dielectric layers 120, 122 of the corner portion 106b of the gate dielectric structure 106 extend over the trench isolation structure by a second distance $d_2$. In some embodiments, a ratio between the first distance $d_1$ and the second distance $d_2$ is in a range of between, for example, approximately 0.5 and approximately 2. In some embodiments, a third distance $d_3$ is measured between outermost sidewalls of the gate dielectric structure 106, and a fourth distance $d_4$ separates opposing first gate dielectric layers 120. In some embodiments a ratio between the first distance $d_1$ and the fourth distance $d_4$ is in a range of between, for example, approximately 0.01 and approximately 0.2. In some embodiments, a ratio between the fourth distance $d_4$ and the third distance $d_3$ is in a range of between, for example, approximately 0.9 and approximately 0.99.

Figure 2A:
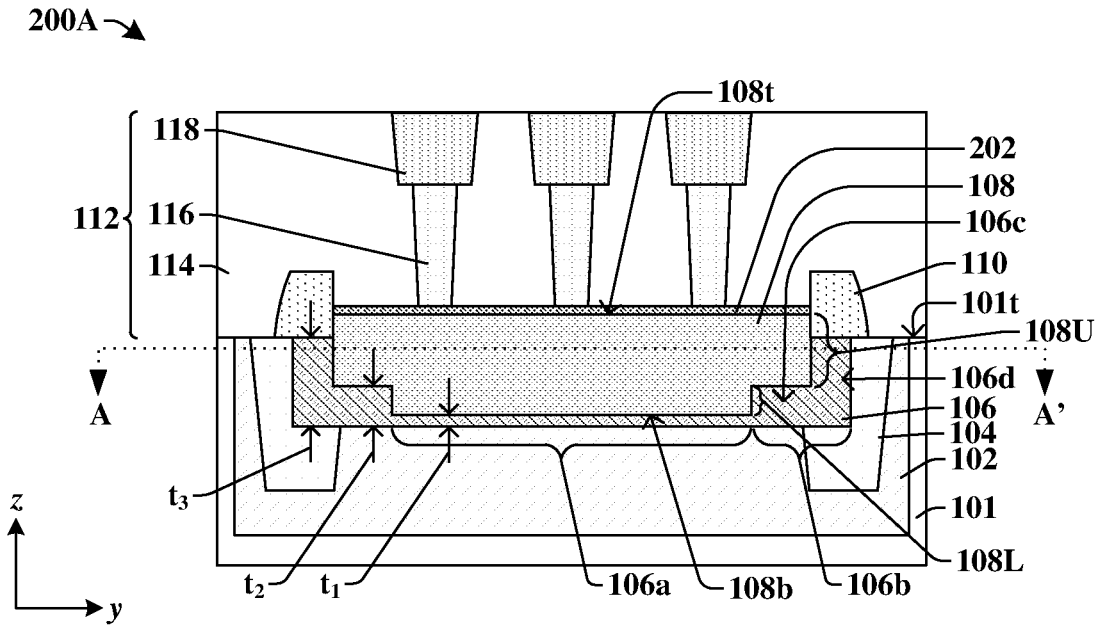
FIGS. 2A and 2B illustrate cross-sectional views of some alternative embodiments of the recessed MOSFET of FIGS. 1A and 1B, respectively.

FIG. 2A illustrates a cross-sectional view 200A of some other embodiments of a recessed MOSFET comprising a gate dielectric structure with a corner portion that is thicker than a central portion.

In some embodiments, the gate electrode 108 has a bottommost surface 108b that is arranged below a topmost surface 101t of the substrate 101 and has a topmost surface 108t that is arranged above the topmost surface 101t of the substrate 101. In some such embodiments, the recessed MOSFET still has an overall reduced height because the gate electrode 108 has a bottommost surface 108b arranged below the topmost surface 101t of the substrate 101. In some embodiments, the spacer structure 110 is arranged on the topmost surface 101t of the substrate 101 and/or the gate dielectric structure 106 and directly contacts outermost sidewalls of the gate electrode 108. Further, in some embodiments, a silicide layer 202 may be arranged over the gate electrode 108 to increase the performance of the contact between the contact vias 116 and the gate electrode 108.

In some embodiments, because of corner portion 106b of the gate dielectric structure 106, the gate electrode 108 comprises a lower portion 108L arranged directly on the central portion 106a of the gate dielectric structure 106 and having outer sidewalls surrounded by the inner corner portion 106c of the gate dielectric structure 106. Further, in some embodiments, the gate electrode 108 comprises an upper portion 108U arranged over the lower portion 108L, directly on the inner corner region 108c of the gate dielectric structure 106, and having outer sidewalls surrounded by the outer corner portion 106d of the gate dielectric structure 106. In some embodiments, the upper portion 108U of the gate electrode 108 is wider than the lower portion 108L of the gate electrode 108. In some embodiments, the lower portion 108L of the gate electrode 108 may have a width measured in the y-direction and in a range of between, for example, approximately 0.1 micrometers and approximately 100 micrometers. Further, in some embodiments, the upper portion 108U of the gate electrode 108 is thicker than the lower portion 108L of the gate electrode 108. In some other embodiments, the upper portion 108U of the gate electrode 108 may be thinner than or about equal in thickness with the lower portion 108L of the gate electrode 108.

In some embodiments, the gate electrode 108 may comprise, for example, polysilicon, aluminum, cobalt, ruthenium, or some other suitable conductive material. Further, in some embodiments, the gate dielectric structure 106 may comprise, for example, silicon oxynitride, silicon dioxide, hafnium oxide, or some other suitable dielectric material. In some embodiments, the first thickness $t_1$ of the gate dielectric structure 106 may be in a range of between, for example, approximately 100 angstroms and approximately 300 angstroms. In some embodiments, the second thickness $t_2$ of the gate dielectric structure 106 may be in range of between, for example, approximately 300 angstroms and approximately 500 angstroms. In some embodiments, the third thickness $t_3$ of the gate dielectric structure 106 may be in a range of between, for example, approximately 0.08 micrometers and approximately 2 micrometers. It will be appreciated that other values for the first, second, and third thicknesses $t_1$, $t_2$, $t_3$ are also within the scope of this disclosure.

Figure 2B:
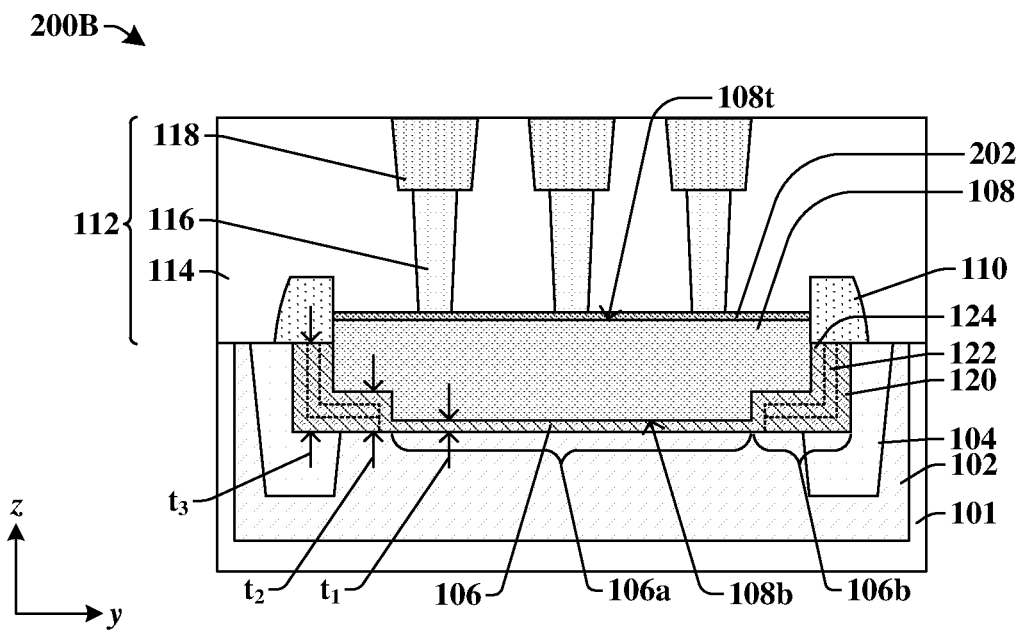

FIG. 2B illustrates a cross-sectional view 200B of an alternative embodiment of the cross-sectional view 200A of FIG. 2A, wherein layers of the gate electrode structure are shown.

As illustrates in the cross-sectional view 200B of FIG. 2B, in some embodiments, the first, second, and third gate dielectric layers 120, 122, 124 of the gate dielectric structure 106 may be distinguishable from one another. In some embodiments, the gate electrode 108 only directly contacts the third gate dielectric layer 124 of the gate dielectric structure 106.

Figure 3:
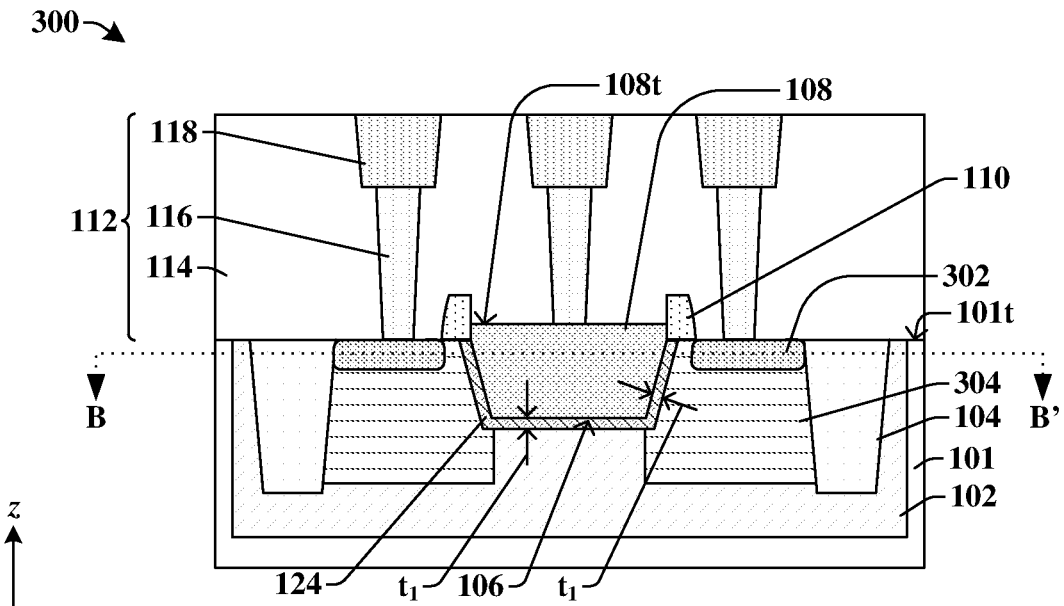
FIG. 3 illustrates a cross-sectional view of some embodiments of a recessed MOSFET having a gate electrode that is surrounded by a gate dielectric structure and that extends between source/drain regions.

FIG. 3 illustrates a cross-sectional view 300 of some embodiment of a recessed MOSFET from an xz-plane.

In some embodiments, the xz-plane is substantially perpendicular to the yz-plane of FIGS. 1A and 2A, for example. In some embodiments, the recessed MOSFET comprises source/drain regions 302 arranged within the area of the substrate 101 defined by the trench isolation structure 104. In some embodiments, the source/drain regions 302 may have an opposite doping type than the well region 102. In some embodiments, the source/drain regions 302 are surrounded by lightly doped regions 304, wherein the lightly doped regions 304 have a same doping type but lower doping concentration than the source/drain regions 302.

In some embodiments, the gate electrode 108 extends between the source/drain regions 302 in the x-direction, and is also recessed within the substrate 101 in the cross-sectional view 300. In some embodiments, the interconnect structure 112 has contact vias 116 coupled to the source/drain regions 302 and the gate electrode 108. In some embodiments, the source/drain regions 302 are arranged directly between the gate electrode 108 and the trench isolation structure 104 in the x-direction. In some embodiments, the spacer structure 110 is arranged on the substrate 101 and directly contacts outer sidewalls of the gate electrode 108. In other embodiments, the gate electrode 108 has a topmost surface 108t that is substantially coplanar with the topmost surface 101t of the substrate 101, and thus, the spacer structure 110 does not directly contact the gate electrode 108.

In some embodiments, from the cross-sectional view 300 on the xz-plane, the corner portion (106b) of the gate dielectric structure 106 is not visible. In some embodiments, from the xz-plane, the gate dielectric structure 106 surrounds a bottom surface and outer sidewalls of the gate electrode 108 to prevent the gate electrode 108 from contacting the well region 102, the lightly doped regions 304, and/or the source/drain regions 302. In some embodiments, from the xz-plane, the gate dielectric structure 106 has the first thickness $t_1$, and thus, the gate dielectric structure 106 arranged directly between the source/drain regions 302 may comprise the one gate dielectric layer having the first thickness $t_1$. In some such embodiments, from the xz-plane, the gate dielectric structure 106 comprises the third gate dielectric layer 124, and the first and second gate dielectric layers (120, 122 of FIG. 2A) are not visible. The gate dielectric structure 106 has a substantially uniform first thickness $t_1$ around the gate electrode 108 between the source/drain regions 302 such that a same "ON" gate voltage may be used to simultaneously turn "ON" an entire channel region below the gate electrode 108 to allow mobile charge carriers to travel between the source/drain regions 302.

Figure 4:
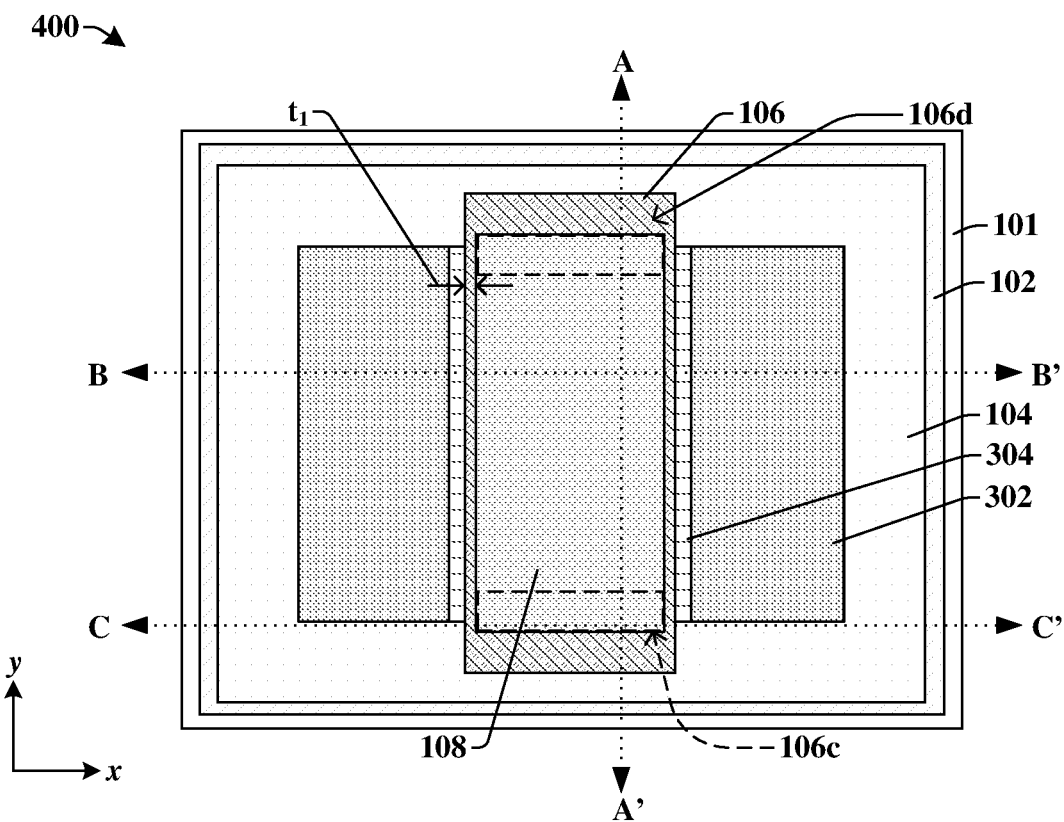
FIG. 4 illustrates a top-view of a recessed MOSFET comprising a gate dielectric structure with a corner portion that is thicker than a central portion.

FIG. 4 illustrates a top-view 400 of some embodiments of a recessed MOSFET transistor comprising a gate dielectric structure with a thicker corner portion.

In some embodiments, cross-section line AA' of FIG. 2A may correspond to the cross-section line AA' of FIG. 4, and cross-section line BB' of FIG. 3 may correspond to the cross-section line BB' of FIG. 4.

The top-view 400 of FIG. 4 shows that in some embodiments, the outer corner portion 106d of the gate dielectric structure 106 directly overlies the trench isolation structure 104. Further, the inner corner portion 106c of the gate dielectric structure 106 is arranged below the gate electrode 108 and is not visible from the top-view 400. Thus, the inner corner portion 106c is illustrated with hashed lines in FIG. 4 for ease of understanding. In some embodiments, the inner corner portion 106c is arranged directly between outer portions of the source/drain regions 302. In some embodiments, any line extending in the x-direction that extends through the source/drain regions 302 does not also extend through the outer corner portion 106d of the gate dielectric structure 106. In some other embodiments, the inner corner portion 106c is not arranged directly between the outer portions of the source/drain regions 302 and thus, any line extending in the x-direction that extends through the source/drain regions 302 does not also extend through the inner corner portion 106c of the gate dielectric structure 106.

Figure 5A:
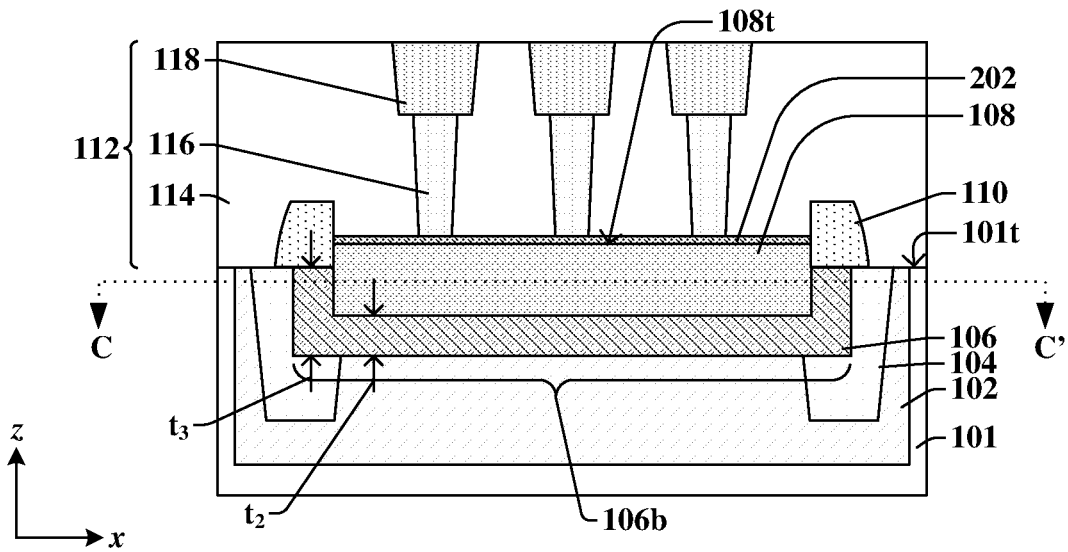
FIGS. 5A and 5B illustrate cross-sectional views of some embodiments from another perspective of a recessed MOSFET comprising a gate dielectric structure with a corner portion that is thicker than a central portion.

FIG. 5A illustrates a cross-sectional view 500A of some embodiments of a recessed MOSFET transistor comprising a gate dielectric structure with a thicker corner portion extending between an isolation structure on the xz-plane. In some embodiments, the cross-sectional view 500A comprises cross-section line CC' which corresponds to cross-section line CC' of FIG. 4.

The cross-section line CC' of FIG. 4 extends through the corner portion 106b of the gate dielectric structure 106. Thus, in some embodiments, the cross-sectional view 500A of FIG. 5A illustrates the corner portion 106b that extends between opposite sides of the trench isolation structure 104. In other words, from some perspectives, the gate dielectric structure 106 continuously has the second thickness $t_2$ as the gate dielectric structure 106 extends in the x-direction between the trench isolation structure 104.

Figure 5B:
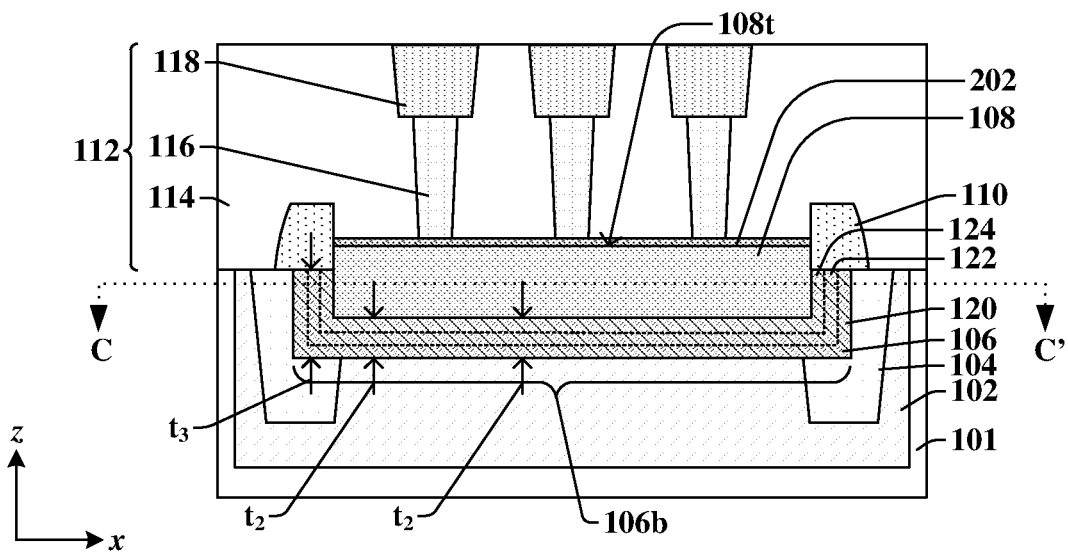

FIG. 5B illustrates a cross-sectional view 500B of an alternative embodiment of the cross-sectional view 500A of FIG. 5A, wherein layers of the gate electrode structure are shown.

As illustrates in the cross-sectional view 500B of FIG. 5B, in some embodiments, the first, second, and third gate dielectric layers 120, 122, 124 of the gate dielectric structure 106 may be distinguishable from one another and extend between opposite sides of the trench isolation structure 104 in the x-direction.

Figure 6:
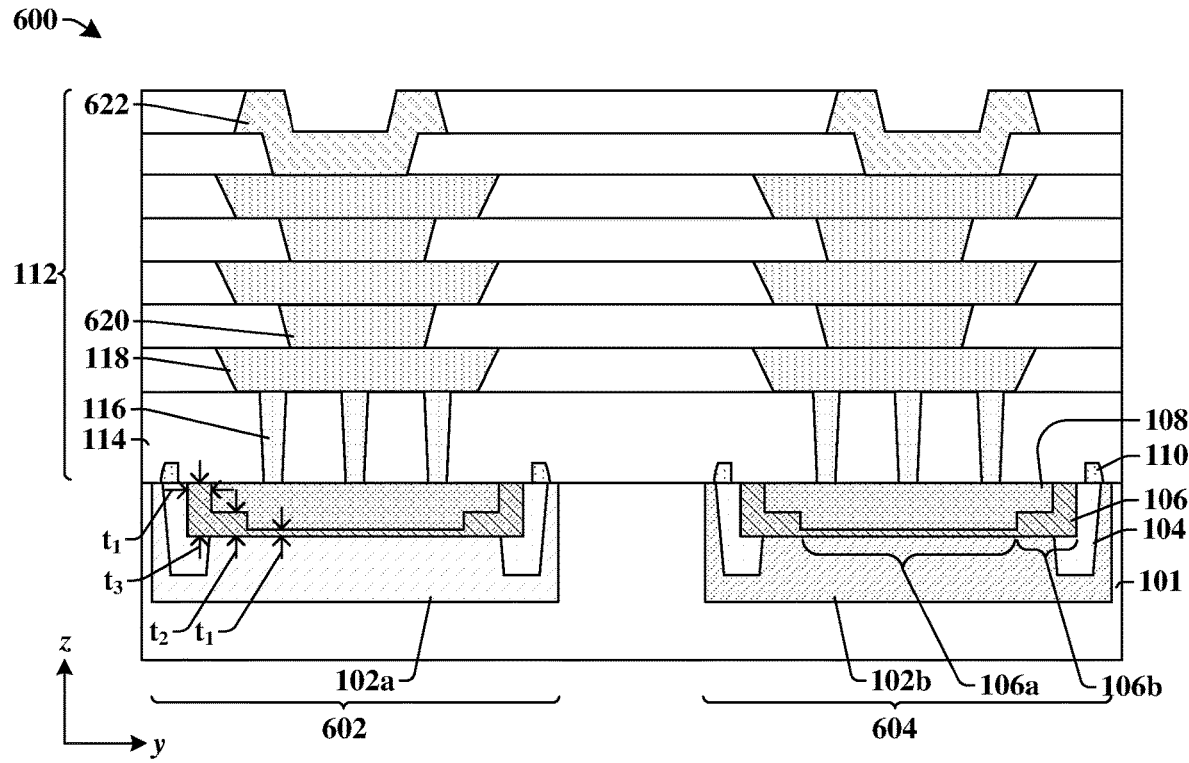
FIG. 6 illustrates a cross-sectional view of some embodiments of two recessed MOSFETs disposed on and within a substrate and comprising gate dielectric structures having corner portions that are thicker than central portions.

FIG. 6 illustrates a cross-sectional view 600 of some embodiments of a first recessed MOSFET arranged beside a second recessed MOSFET on a yz-plane.

In some embodiments, an integrated chip comprises a first recessed MOSFET 602 arranged beside a second recessed MOSFET 604. In some embodiments, the first recessed MOSFET 602 may be an n-type MOSFET, wherein mobile charge carriers are electrons when the first recessed MOSFET 602 is turned "ON." In such embodiments, the first recessed MOSFET 602 may have a first well region 102a that is p-type. In some embodiments, the second recessed MOSFET 604 may be a p-type MOSFET, wherein mobile charge carriers are holes when the second recessed MOSFET 604 is turned "ON." In such embodiments, the second recessed MOSFET 604 may have a second well region 102b that is n-type.

In some embodiments, the first and second recessed MOSFETs 602, 604 comprise the gate dielectric structure 106 having the corner portion 106b that has a greater thickness than a central portion 106a. In some embodiments, the interconnect structure 112 further comprises interconnect vias 620 and bond pads 622. Other integrated chips and/or semiconductor devices may be coupled to the first and/or second recessed MOSFETs 602, 604 through the bond pads 622.

Figure 7:
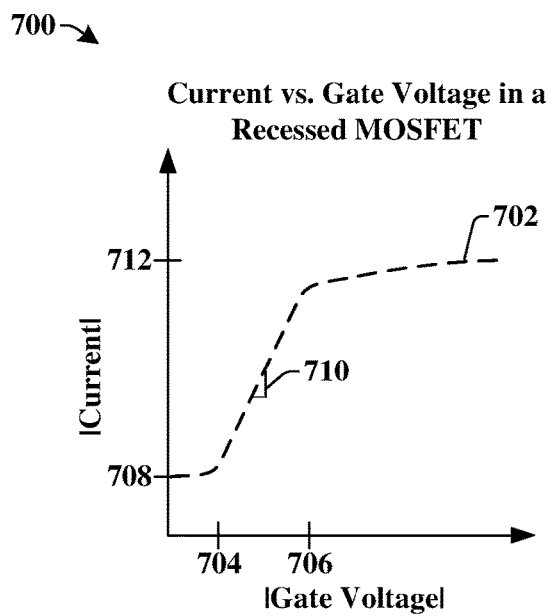
FIG. 7 illustrates a plot of current vs. gate voltage when applied to a recessed MOSFET comprising a gate dielectric structure with a corner portion that is thicker than a central portion.

FIG. 7 illustrates a plot 700 of some embodiments of current versus gate voltage when applied to a recessed MOSFET having a gate dielectric structure with a corner portion that is thicker than a central portion as illustrated in FIGS. 1A-6, for example.

The plot 700 illustrates exemplary data points 702 of the absolute value of a current in a recessed MOSFET that changes as an absolute value of a voltage applied to the gate electrode (108 of FIG. 3) increases. In some embodiments, current begins to flow through the recessed MOSFET when the gate voltage equals a transition voltage 704 and a first transition current 708 travels through the recessed MOSFET. In some embodiments, as the gate voltage is increased from the transition voltage 704, the current may increase at a substantially constant rate until the current reaches a saturation current 712 at a threshold voltage 706, wherein a channel region is completely open below the gate electrode (108 of FIG. 3) and between the source/drain regions (302 of FIG. 3). In some embodiments, because of the corner portion (106b of FIG. 2A) of the gate dielectric structure (106 of FIG. 2A) in the recessed MOSFET the threshold voltage 706 throughout the recessed MOSFET (e.g., at the cross-sectional view 200A of FIG. 2A and at the cross-sectional view 300 of FIG. 3) is substantially the same, and thus, a slope 710 of the exemplary data points 702 is indeed substantially constant between the first transition current 708 and the saturation current 712. With a substantially constant slope 710, the recessed MOSFET is more reliable than if the slope 710 varied between the first transition current 708 and the saturation current 712.

Figure 8A:
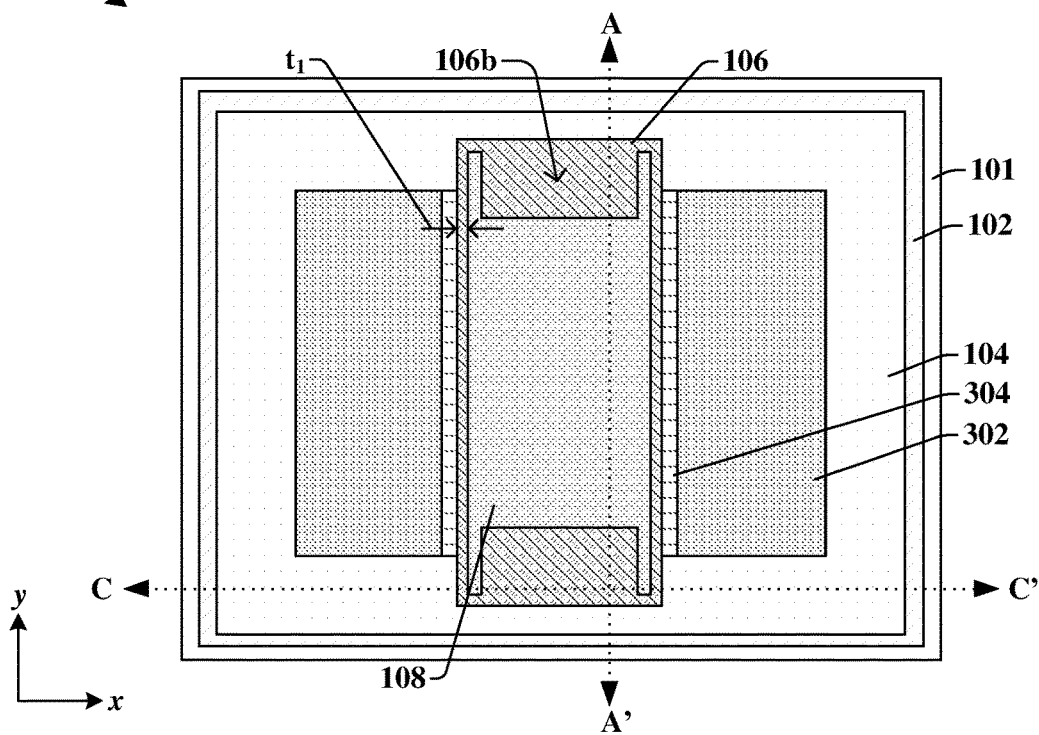
FIGS. 8A-C, 9A-C, and 10A-C illustrate various views of some alternative embodiments of a recessed MOSFET comprising a gate dielectric structure with a corner portion that is thicker than a central portion.
Figure 8B:
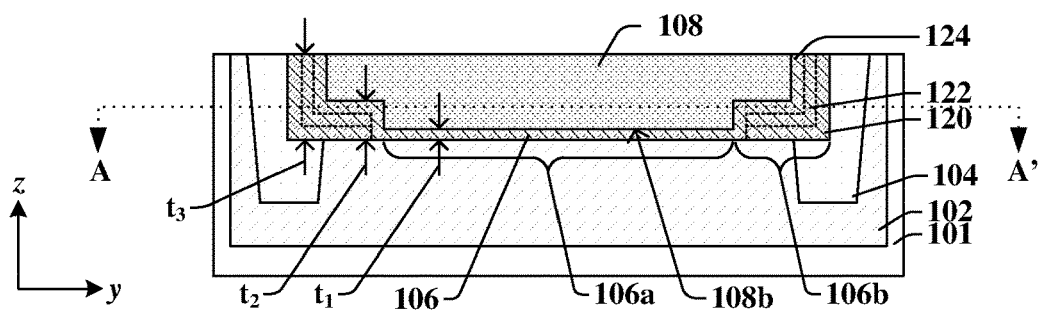
Figure 8C:
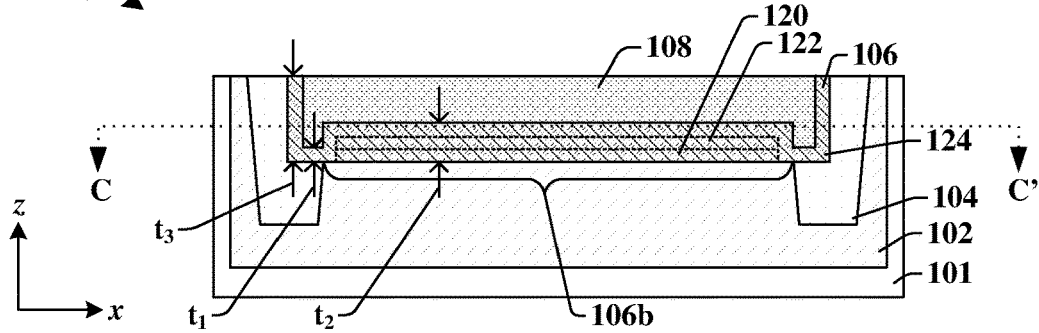

FIGS. 8A-C illustrates various views 800A-C of some alternative embodiments of a recessed MOSFET with a gate dielectric structure comprising a corner portion that is thicker than a central portion.

As shown in top-view 800A of FIG. 8A, in some embodiment, the corner portion 106b of the gate dielectric structure 106 does not continuously extend in the x-direction between outermost portions of the gate dielectric structure 106.

Cross-sectional view 800B of FIG. 8B illustrates some embodiments the recessed MOSFET of FIG. 8A from the yz-plane. In some embodiments, cross-section line AA' of FIG. 8A corresponds to cross-section line AA' of FIG. 8B. In other words, in some embodiments, the cross-sectional view 800B of FIG. 8B corresponds to the cross-section line AA' of the top-view 800A of FIG. 8A. Further, the top-view 800A of FIG. 8A corresponds to the cross-section line AA' of FIG. 8B.

As illustrated in the cross-sectional view 800B of FIG. 8B, the cross-section line AA' of FIG. 8A extends through the corner portion 106b of the gate dielectric structure 106. Thus, in some embodiments, the cross-sectional view 800B of FIG. 8B comprises a gate dielectric structure 106 having a corner portion 106b that surrounds and is thicker than a central portion 106a.

Cross-sectional view 800C of FIG. 8C illustrates some embodiments of the recessed MOSFET of FIG. 8A from the xz-plane. In some embodiments, cross-section line CC' of FIG. 8A corresponds to cross-section line CC' of FIG. 8C. In other words, in some embodiments, the cross-sectional view 800C of FIG. 8C corresponds to the cross-section line CC' of FIG. 8A. Further, the top-view 800A of FIG. 8A corresponds to the cross-section line CC' of FIG. 8C.

In some embodiments, the corner portion 106b having the second thickness $t_2$ extends completely between opposite sides of the trench isolation structure 104. However, in some embodiments, the corner portion 106b may not or only partially directly overlies the trench isolation structure 104. In some other embodiments, from the cross-sectional view 800C of FIG. 8C the xz-plane, the trench isolation structure 104 continuously underlies the entire gate dielectric structure 106.

In some embodiments, the first and second gate dielectric layers 120, 122 are arranged directly between the third gate dielectric layer 124 and the well region 102. Further, in some embodiments, from the xz-plane, the third gate dielectric layer 124 surrounds outermost sidewalls of the first and second gate dielectric layers 120, 122 that are normal to the x-direction. In some such embodiments, the third gate dielectric layer 124 separates the first and second gate dielectric layers 120, 122 from the trench isolation structure 104.

Figure 9A:
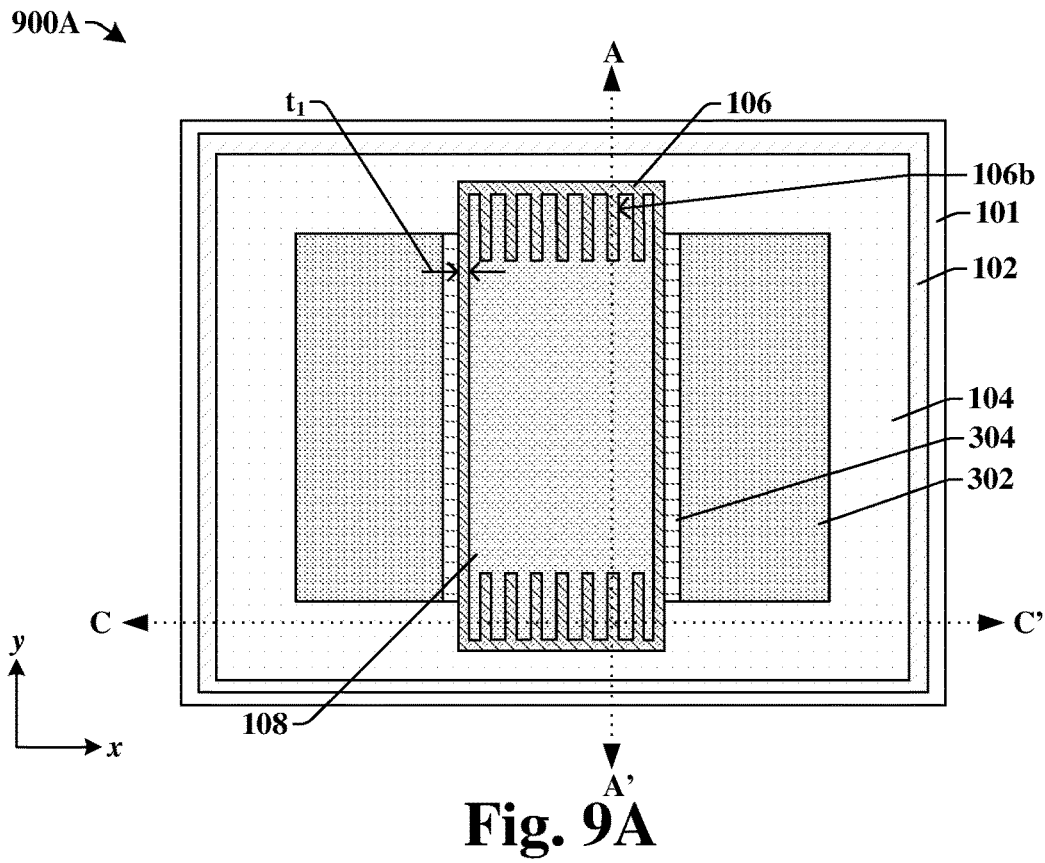
Figure 9B:
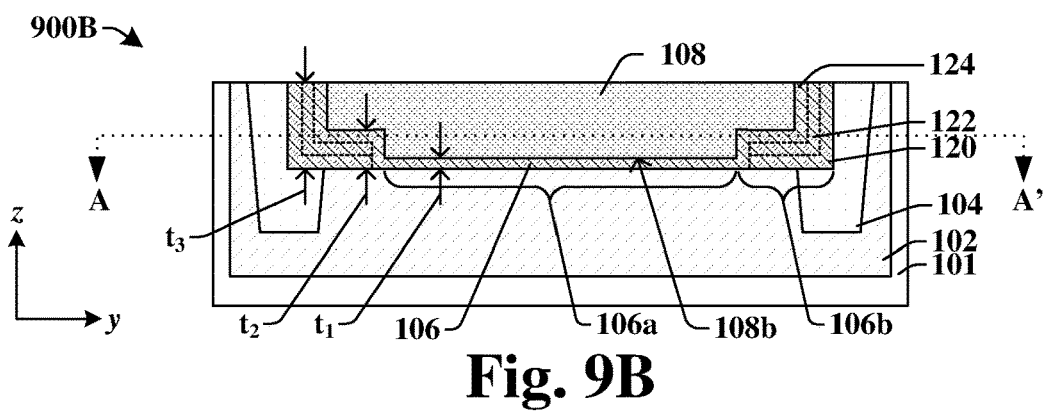
Figure 9C:
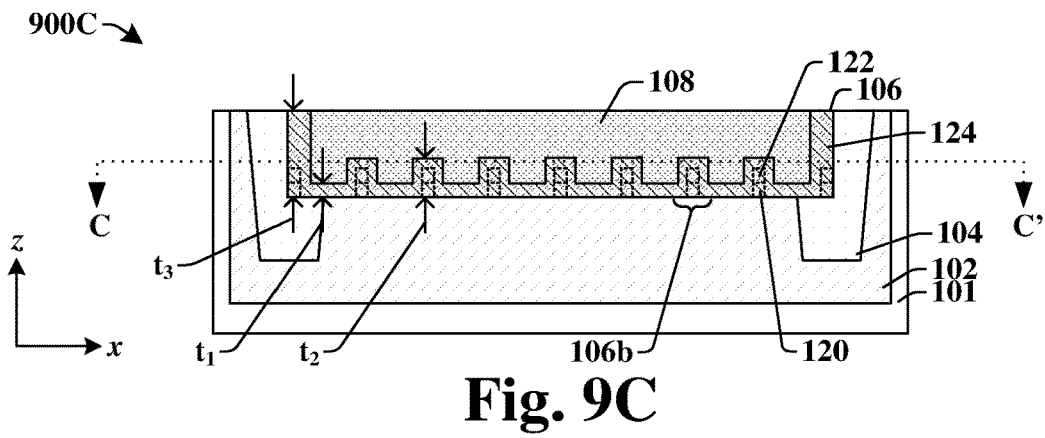

FIGS. 9A-C illustrates various views 900A-C of some other alternative embodiments of a recessed MOSFET with a gate dielectric structure comprising a corner portion that is thicker than a central portion.

As shown in top-view 900A of FIG. 9A, in some embodiments, multiple corner portions 106b are arranged over the trench isolation structure 104. In some such embodiments, a line extending in the x-direction may intersect many corner portions 106b.

In some embodiments, cross-section line AA' of FIG. 9A corresponds to cross-section line AA' of FIG. 9B. In other words, in some embodiments, the cross-sectional view 900B of FIG. 9B corresponds to the cross-section line AA' of the top-view 900A of FIG. 9A. Further, the top-view 900A of FIG. 9A corresponds to the cross-section line AA' of FIG. 9B.

As illustrated in the cross-sectional view 900B of FIG. 9B, the cross-section line AA' of FIG. 9A extends through the corner portions 106b of the gate dielectric structure 106 in the y-direction. Thus, in some embodiments, the cross-sectional view 900B of FIG. 9B comprises a gate dielectric structure 106 having a corner portion 106b that surrounds and is thicker than a central portion 106a.

Cross-sectional view 900C of FIG. 9C illustrates some embodiments of the recessed MOSFET of FIG. 9A from the xz-plane. In some embodiments, cross-section line CC' of FIG. 9A corresponds to cross-section line CC' of FIG. 9C. In other words, in some embodiments, the cross-sectional view 900C of FIG. 9C corresponds to the cross-section line CC' of the top-view 900A of FIG. 9A. Further, the top-view 900A of FIG. 9A corresponds to the cross-section line CC' of FIG. 9C.

As illustrated in the cross-sectional view 900C of FIG. 9C, in some embodiments, multiple corner portions 106b of the gate dielectric structure 106 are arranged between opposite sides of the trench isolation structure 104 in the x-direction. In some embodiments, the third gate dielectric layer 124 continuously extends between the corner portions 106b.

Figure 10A:
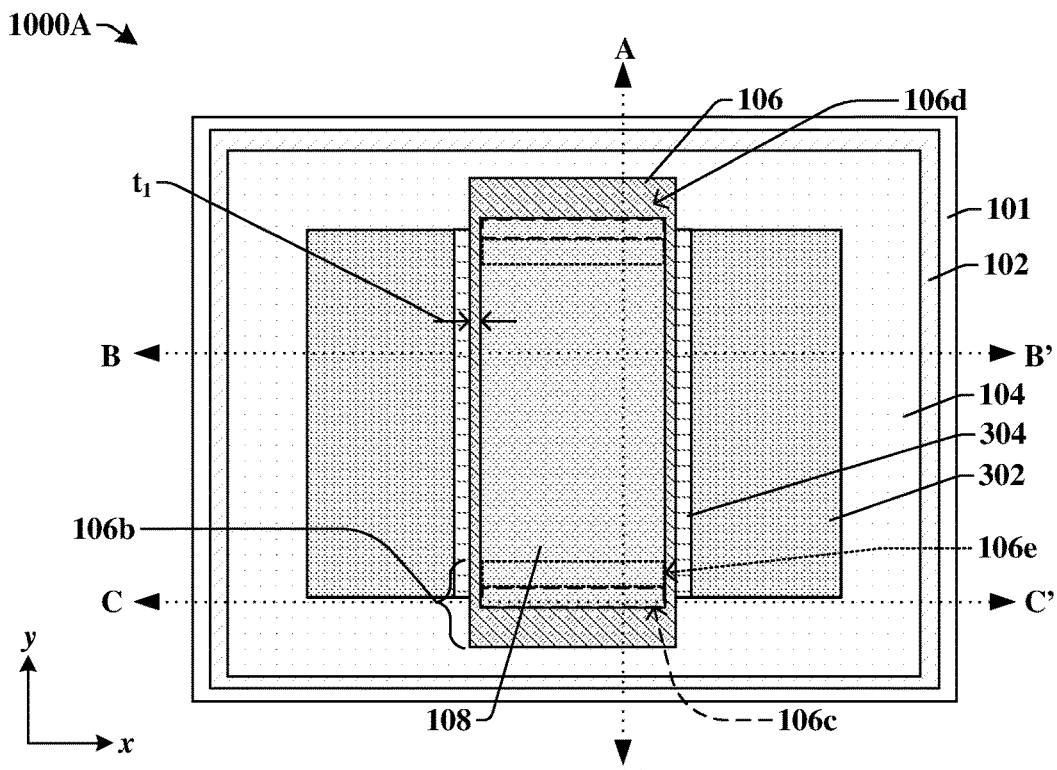
Figure 10B:
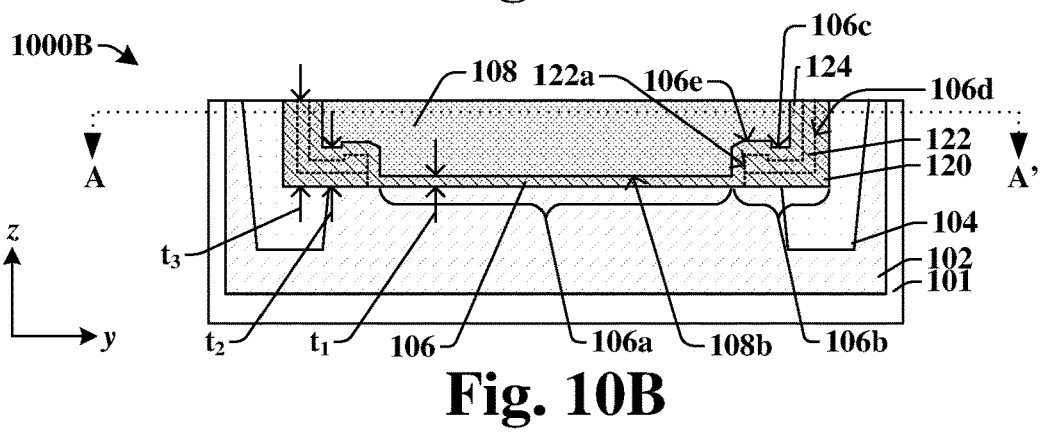
Figure 10C:
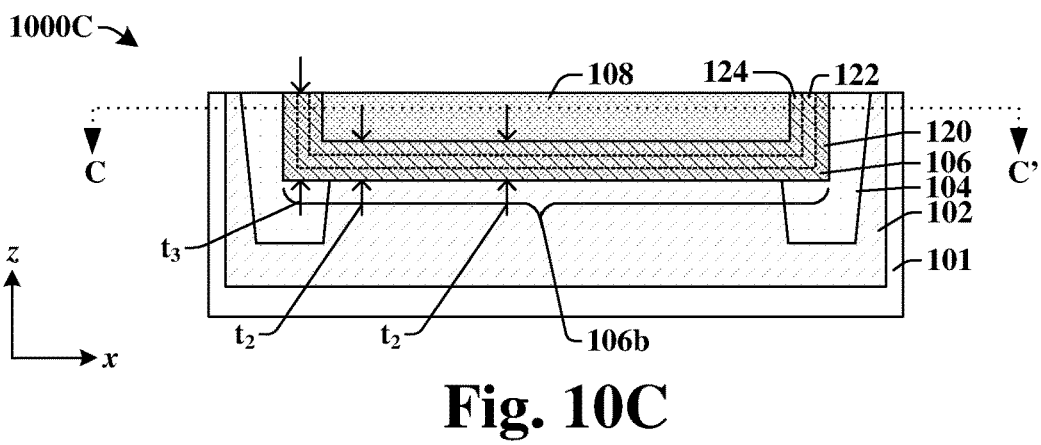

FIGS. 10A-C illustrates various views 1000A-C of some other alternative embodiments of a recessed MOSFET with a gate dielectric structure comprising a corner portion that is thicker than a central portion.

As shown in top-view 1000A of FIG. 10A, in some embodiments, the corner portion 106b of the gate dielectric structure 106 comprises an additional inner corner portion 106e, wherein the inner corner portion 106c is between the outer corner portion 106d and the additional inner corner portion 106e. In some embodiments, the additional inner corner portion 106e is arranged directly between the source/drain regions 302, whereas in other embodiments, the additional inner corner portion 106e is not arranged directly between the source/drain regions 302. Further, in some embodiments, from the top-view 1000A of FIG. 10A, the additional inner corner portion 106e is arranged behind the gate electrode 108, and thus, is illustrated with dotted lines.

In some embodiments, cross-section line AA' of FIG. 10A corresponds to cross-section line AA' of FIG. 10B. In other words, in some embodiments, the cross-sectional view 1000B of FIG. 10B corresponds to the cross-section line AA' of the top-view 1000A of FIG. 10A. Further, the top-view 1000A of FIG. 10A corresponds to the cross-section line AA' of FIG. 10B.

As illustrated in the cross-sectional view 1000B of FIG. 10B, the cross-section line AA' of FIG. 10A extends through the corner portions 106b of the gate dielectric structure 106 in the y-direction. Thus, in some embodiments, the cross-sectional view 1000B of FIG. 10B comprises a gate dielectric structure 106 having a corner portion 106b that surrounds and is thicker than a central portion 106a. Further, in some embodiments, the gate dielectric structure 106 comprises an additional inner corner portion 106e that is thicker than the central portion 106a and the inner corner portion 106c of the gate dielectric structure 106. In some such embodiments, the additional inner corner portion 106e may comprise a thicker portion 122a of the second gate dielectric layer 122. In some such embodiments, the additional inner corner portion 106e of the gate dielectric structure 106 may be arranged directly over the well region 102 and not the trench isolation structure 104. In some other embodiments, the additional inner corner portion 106e may directly overlie the trench isolation structure 104. In some embodiments, the additional inner corner portion 106e is thicker than the inner corner portion 106c which further reduces undesired current flow in the well region 102 of the substrate 101.

Cross-sectional view 1000C of FIG. 10C illustrates some embodiments of the recessed MOSFET of FIG. 10A from the xz-plane. In some embodiments, cross-section line CC' of FIG. 10A corresponds to cross-section line CC' of FIG. 10C. In other words, in some embodiments, the cross-sectional view 1000C of FIG. 10C corresponds to the cross-section line CC' of the top-view 1000A of FIG. 10A. Further, the top-view 1000A of FIG. 10A corresponds to the cross-section line CC' of FIG. 10C.

As illustrated in the cross-sectional view 1000C of FIG. 10C, in some embodiments, from the xz-plane, the corner portion 106b comprises the first, second, and third gate dielectric layers 120, 122, 124 that continuously extend between opposite sides of the trench isolation structure 104. In some such embodiments, the cross-section line CC' of FIG. 10A does not intersect with the additional inner corner portion 106e, and thus, the additional inner corner portion (106e of FIG. 10A) is not present in the cross-sectional view 1000C of FIG. 10C.

FIGS. 11A-B through 27A-B illustrate various views 1100A-B through 2700A-B of some embodiments of a method of forming a recessed MOSFET having a gate dielectric structure with a corner portion that is thicker than a central portion. Although FIGS. 11A-B through 27A-B are described in relation to a method, it will be appreciated that the structures disclosed in FIGS. 11A-B through 27A-B are not limited to such a method, but instead may stand alone as structures independent of the method.

Figure 11A:
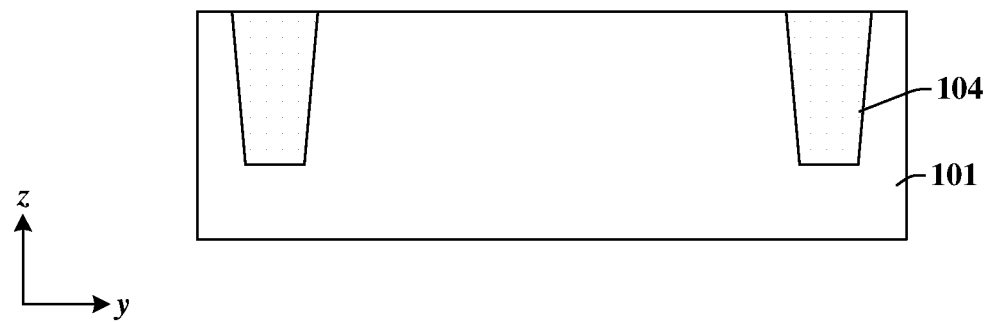
FIGS. 11A-11B through 27A-27B illustrate various views of some embodiments of a method of forming a recessed MOSFET comprising a gate dielectric structure with a corner portion that is thicker than a central portion.

As shown in cross-sectional view 1100A of FIG. 11A, a substrate 101 is provided. In various embodiments, the substrate 101 may comprise any type of semiconductor body (e.g., silicon/CMOS bulk, SiGe, SOI, etc.) such as a semiconductor wafer or one or more die on a wafer, as well as any other type of semiconductor material. In some embodiments, a trench isolation structure 104 may be formed within the substrate 101. The trench isolation structure 104 may be formed by selectively etching the substrate 101 to form a trench defined by sidewalls of the substrate 101. The trench is subsequently filled with one or more dielectric materials, such as, for example, silicon-dioxide, thereby forming the trench isolation structure 104. In some embodiments, the trench isolation structure 104 continuously surround an area of the substrate 101. In some embodiments, the cross-sectional view 1100A represents the trench isolation structure 104 from an xz-plane and from a yz-plane perspective.

Figure 11B:
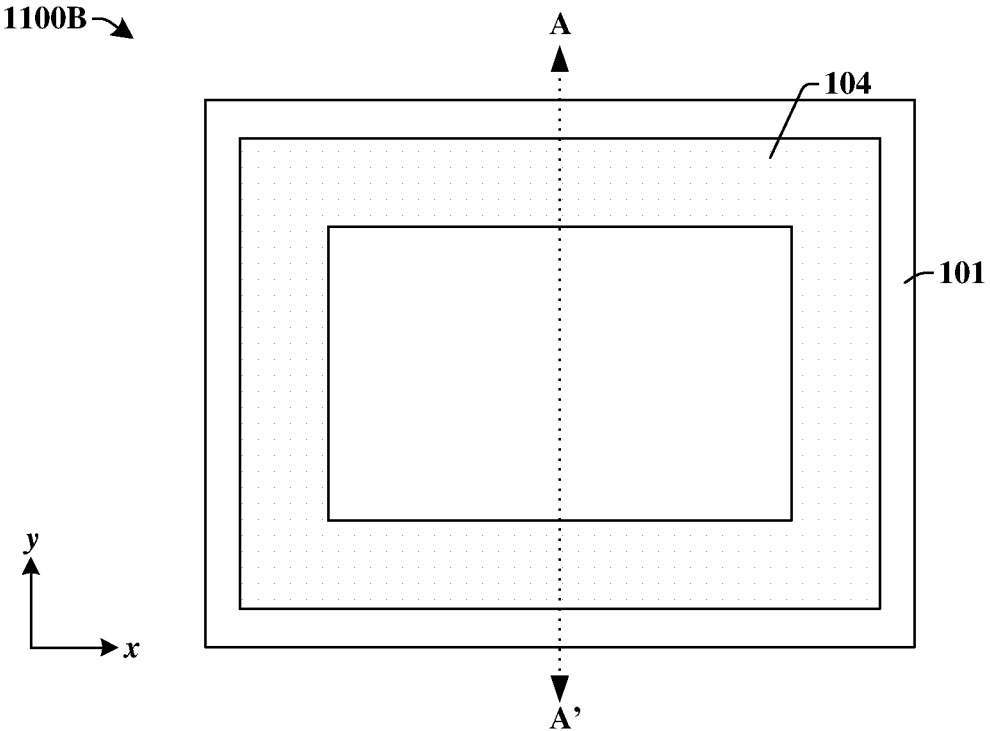

FIG. 11B illustrates a top-view 1100B of some embodiments that may correspond to FIG. 11A. In some embodiments, cross-section line AA' of FIG. 11B corresponds to the cross-sectional view 1100A of FIG. 11A. The top-view 1100B is on the xy-plane. In some embodiments, the trench isolation structure 104 is a continuously connected ring-like structure within the substrate 101.

Figure 12A:
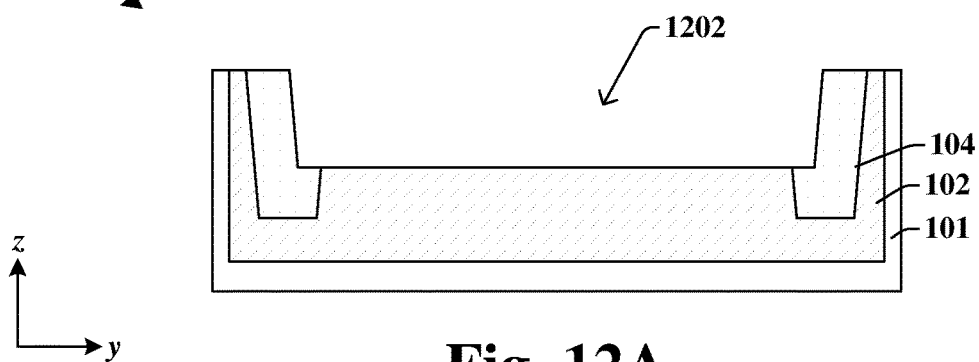
Figure 12B:
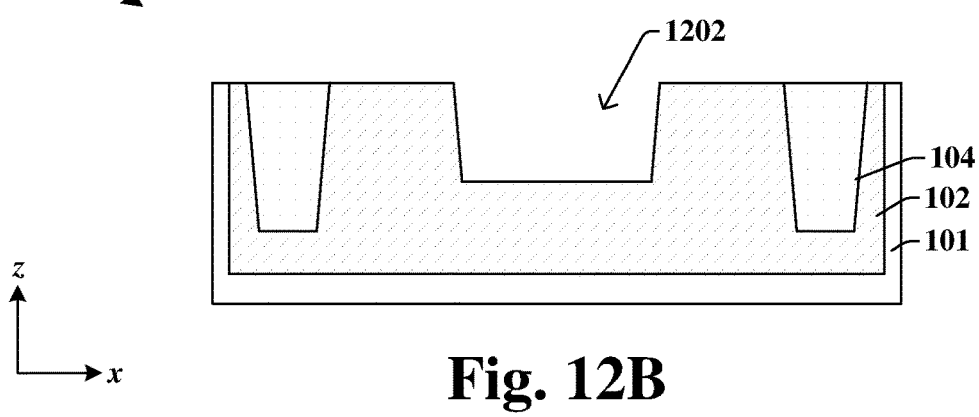
Figure 12C:
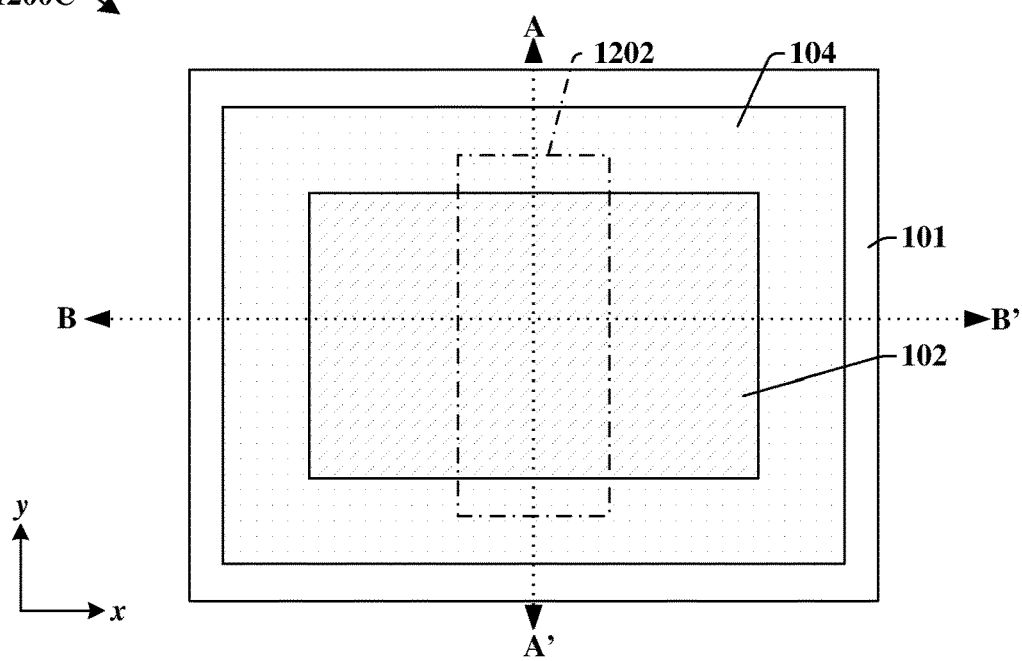

In the following FIGS. 12A-27B, the "A" figures represent a certain step in the method of forming the recessed MOSFET from a cross-sectional view on an yz-plane; the "B" figures represent the certain step in the method of forming the recessed MOSFET from a cross-sectional view on an xz-plane; and the "C" figures represent the certain step in the method of forming the recessed MOSFET from a top-view on an xy-plane. For example, cross-sectional view 1200A of FIG. 12A is on the yz-plane, the cross-sectional view 1200B of FIG. 12B is on the xz-plane, and the top-view 1200C of FIG. 12C is on the xy-plane. Further, FIGS. 12A, 12B, and 12C illustrate a same step of the method, just from different planes/perspectives.

As illustrated in the cross-sectional view 1200A of FIG. 12A, a recess 1202 is formed by photolithography and subsequent etching of the substrate 101 between the trench isolation structure 104. In some embodiments, inner portions of the trench isolation structure 104 are removed, and thus, the recess 1202 has outer sidewalls defined by the trench isolation structure 104. In some embodiments, a depth of the recess 1202 is in a range of between, for example, approximately 0.08 micrometers to approximately 2 micrometers. Further, in some embodiments, the substrate 101 undergoes an ion implantation process to form a well region 102 between the trench isolation structure 104. In some embodiments, the well region 102 also extends below and/or past outer sidewalls of the trench isolation structure 104. In some embodiments, the well region 102 has either a first doping type (e.g., n-type) or a second doping type (e.g., p-type).

As illustrated in the cross-sectional view 1200B of FIG. 12B, in some embodiments, the recess 1202 does not extend into the trench isolation structure 104. Thus, from the perspective of the xz-plane, the recess 1202 has outer sidewalls defined by the substrate 101. Further, in some embodiments, the recess 1202 is narrower in the x-direction than in the y-direction of FIG. 12A.

As illustrated in the top-view 1200C of FIG. 12C, in some embodiments, the recess 1202 extends between the trench isolation structure 104 in the y-direction. A hash-dot line is used to define outer sidewalls of the recess 1202 from the top-view 1200C. In some embodiments, the cross-sectional view 1200A of FIG. 12A corresponds to cross-section line AA' of FIG. 12C, and the cross-sectional view 1200B of FIG. 12B corresponds to cross-section line BB's of FIG. 12C.

Figure 13A:
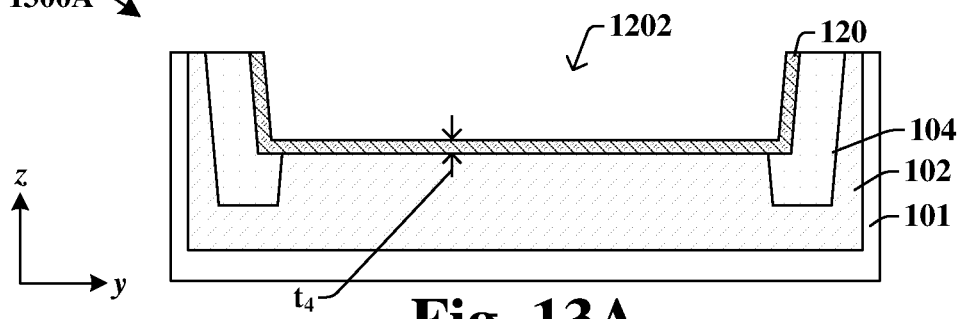

As illustrated in cross-sectional view 1300A of FIG. 13A, a first gate dielectric layer 120 is deposited on surfaces of the recess 1202. In some embodiments, the first gate dielectric layer 120 may comprise, for example, silicon dioxide, silicon oxynitride, hafnium oxide, or some other suitable dielectric material. In some embodiments, the first gate dielectric layer 120 is formed by way of a thermal oxide process. In other embodiments, the first gate dielectric layer 120 may be formed by way of a deposition process (e.g., chemical vapor deposition (CVD), physical vapor deposition (PVD), atomic layer deposition (ALD), etc.). In some embodiments, the first gate dielectric layer 120 is formed on upper surfaces of the trench isolation structure 104, whereas in other embodiments, the first gate dielectric layer 120 is not formed on upper surfaces of the trench isolation structure 104. In some embodiments, the first gate dielectric layer 120 has a fourth thickness $t_4$ that is substantially uniform on the surfaces of the recess 1202. In some embodiments, the fourth thickness $t_4$ is in a range of between, for example, approximately 100 angstroms and approximately 200 angstroms.

Figure 13B:
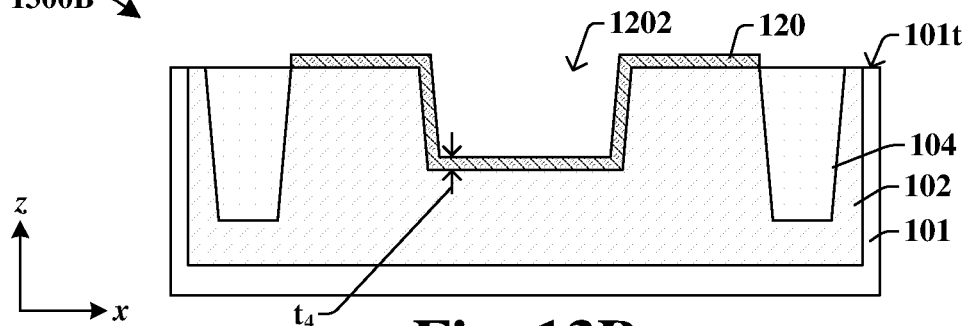

As illustrated in cross-sectional view 1300B of FIG. 13B, in some embodiments, the first gate dielectric layer 120 is also visible from the xz-plane. In some embodiments, the first gate dielectric layer 120 is also formed over portions of a topmost surface 101t of the substrate 101.

Figure 14A:
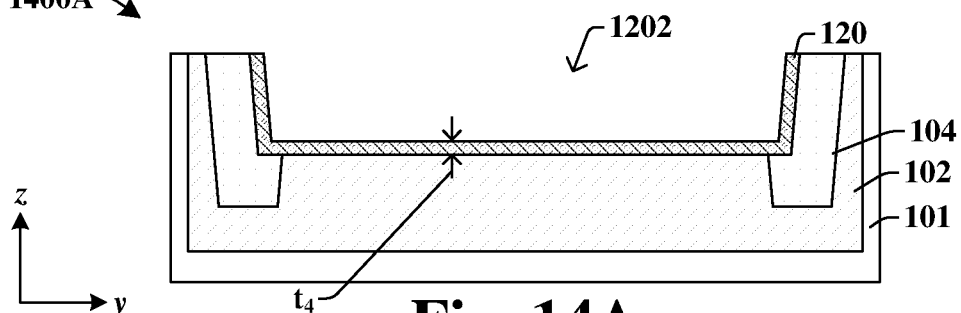
Figure 14B:
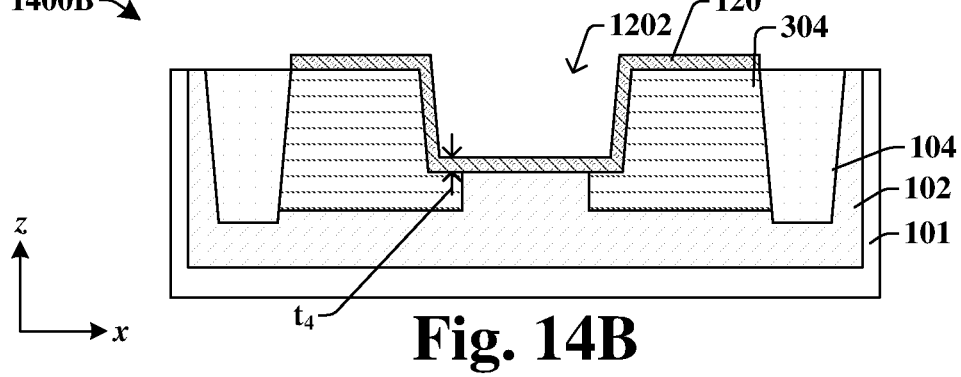

As illustrated in cross-sectional view 1400A of FIG. 14A and cross-sectional view 1400B of FIG. 14B, in some embodiments, lightly doped regions 304 are formed directly between the trench isolation structure 104 and the recess 1202 in the x-direction. Thus, in some embodiments, the cross-sectional view 1400A of FIG. 14A does not change between FIG. 13A and FIG. 114A. In some embodiments, the lightly doped regions 304 are formed using photolithography and an ion implantation process such that the lightly doped regions 304 are arranged directly between the trench isolation structure 104 and the recess 1202 and also have a doping type different than the well region 102.

In some other embodiments, the lightly doped regions 304 and/or the well region 102 are formed before the formation of the first gate dielectric layer 120 within the recess 1202. Thus, it will be appreciated that the order of the steps of the method illustrated in FIGS. 11A-14B may vary.

Figure 15A:
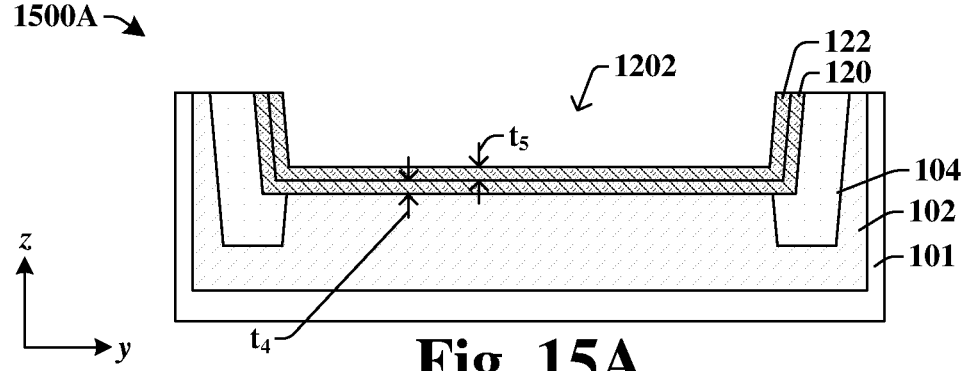
Figure 15B:
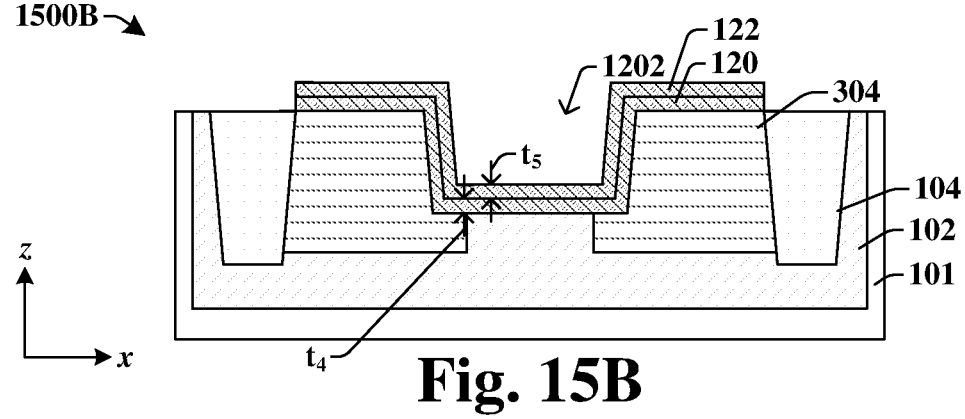

As illustrated in cross-sectional view 1500A of FIG. 15A and in cross-sectional view 1500B of FIG. 15B, a second gate dielectric layer 122 is formed directly on the first gate dielectric layer 120. In some embodiments, the second gate dielectric layer 122 comprises a same material as the first gate dielectric layer 120. In some other embodiments, the second gate dielectric layer 122 may comprise a different material than the first gate dielectric layer 120. In some embodiments, the second gate dielectric layer 122 may be formed by way of chemical vapor deposition (CVD) or by way of some other suitable deposition process (e.g., PVD, ALD, etc.). Further, in some embodiments, the second gate dielectric layer 122 may comprise a high temperature oxide. For example, in some embodiments, the second gate dielectric layer 122 may comprise silicon dioxide formed at a high temperature. In some such embodiments, the reactants to form the high temperature silicon dioxide may comprise dichlorosilane and nitrous oxide and may react in a chamber set to a temperature in a range of between, for example approximately 800 degrees Celsius and approximately 1000 degrees Celsius. In some other embodiments, the high temperature oxide may comprise silicon oxynitride.

In some embodiments, the second gate dielectric layer 122 has a fifth thickness $t_5$ that is substantially uniform over the first gate dielectric layer 120. In some embodiments, the fifth thickness $t_5$ is in a range of between, for example, approximately 100 angstroms and approximately 200 angstroms.

Figure 16A:
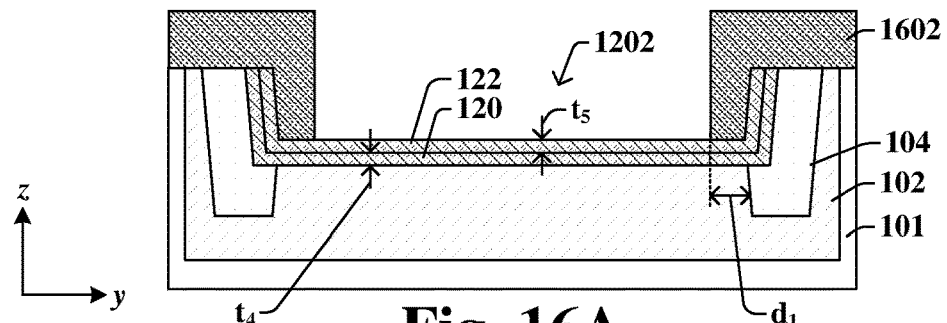
Figure 16B:
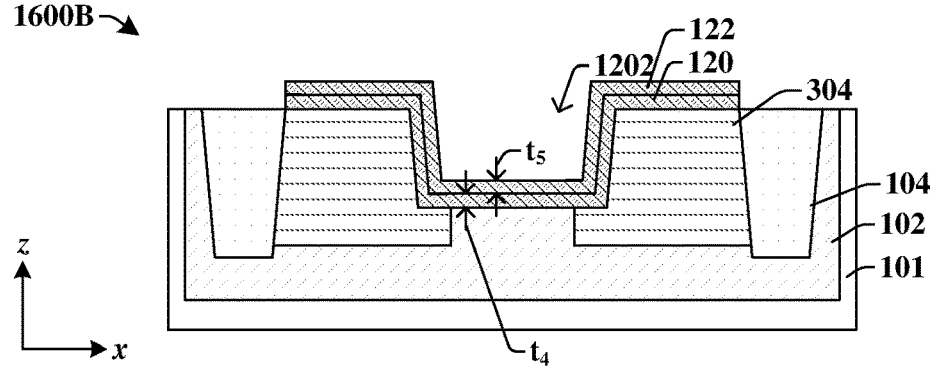

As illustrated in cross-sectional view 1600A of FIG. 16A and in cross-sectional view 1600B of FIG. 16B, in some embodiments, a first masking structure 1602 is formed directly over portions of the first and second gate dielectric layers 120, 122 that directly contact and/or directly overlie the trench isolation structure 104. Thus, in some embodiments, the first masking structure 1602 is visible in the cross-sectional view 1600A of FIG. 16A on the yz-plane, but is not visible in the cross-sectional view 1600B of FIG. 16B on the xz-plane. In some other embodiments, the first masking structure 1602 may cover the trench isolation structure 104 from the xz-plane and thus, be visible from the xz-plane. In some embodiments, the first masking structure 1602 also directly overlies a portion of the well region 102 that is in direct contact with the first gate dielectric layer 120. In some embodiments, the first masking structure 1602 directly overlies the portion of the well region 102 by a first distance $d_1$ that is measured in the y-direction. In some embodiments, the first distance $d_1$ is in a range of between, for example, approximately 0.1 micrometers and approximately 0.3 micrometers.

In some embodiments, the first masking structure 1602 may be formed using photolithography and removal (e.g., etching) processes. In some embodiments, the first masking structure 1602 comprises a photoresist material or a hard mask material. In some embodiments, the first masking structure 1602 also directly covers the trench isolation structure 104 in the cross-sectional view 1600A of FIG. 16A. In some other embodiments, the first masking structure 1602 may also be formed over the entire trench isolation structure 104, and thus, in some embodiments, the first masking structure 1602 may be present directly over the trench isolation structure 104 in the cross-sectional view 1600B of FIG. 16B.

Figure 16C:
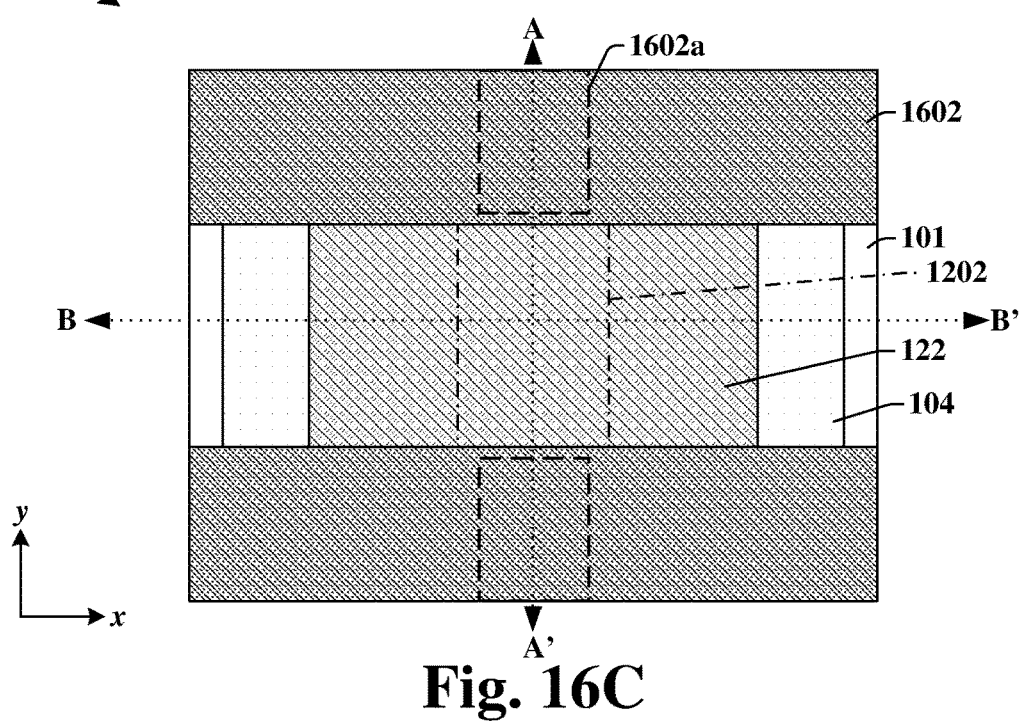

As illustrated in top-view 1600C of FIG. 16C, in some embodiments, the first masking structure 1602 resembles two rectangles. In some embodiments, the cross-sectional view 1600A of FIG. 16A corresponds to cross-section line AA' of FIG. 16C, and the cross-sectional view 1600B of FIG. 16B corresponds to cross-section line BB' of FIG. 16C. In some other embodiments, the first masking structure 1602 may also completely cover the trench isolation structure 104 from the top-view 1600C of FIG. 16C to protect the trench isolation structure 104 from future removal processes.

In some other embodiments, the first masking structure 1602 has a different design from the top-view 1600C to achieve different gate electrode structure designs such as those illustrated in FIGS. 8A-C, 9A-C, and/or 10A-C. For example, in some other embodiments, an alternative first masking structure 1602a of FIG. 16C may be used instead of the first masking structure 1602. In such other embodiments, the alternative first masking structure 1602a, which is illustrated with hashed lines is narrower in the x-direction than the recess 1202. In some such other embodiments, the alternative first masking structure 1602a may be used to form the embodiment illustrated in FIGS. 8A-C.

Figure 17A:
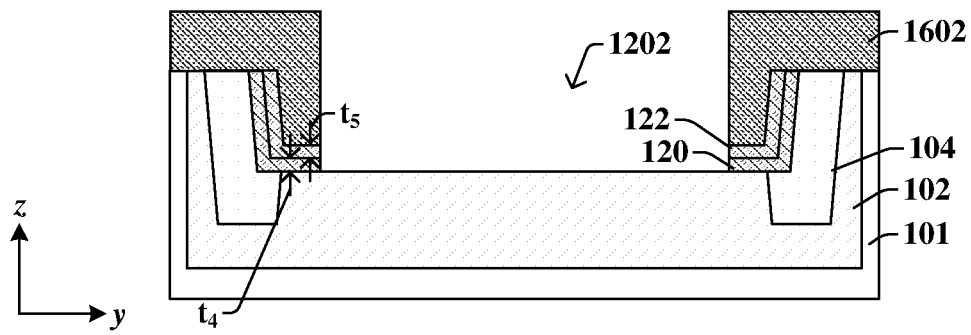
Figure 17B:
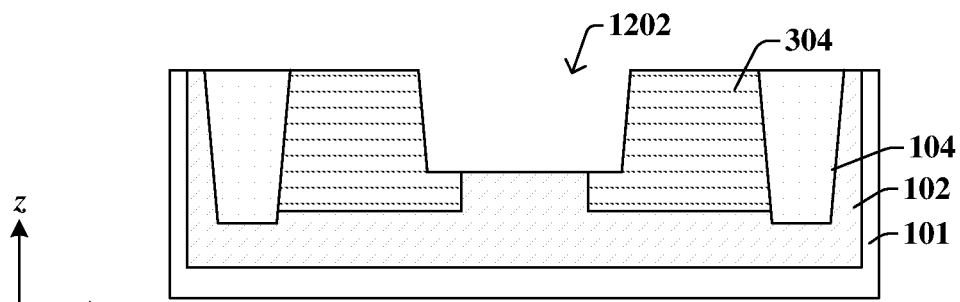

As shown in cross-sectional view 1700A of FIG. 17A and cross-sectional view 1700B of FIG. 17B, in some embodiments, a removal process is conducted to remove portions of the first and second gate dielectric layers 120, 122 that do not directly underlie the first masking structure 1602. Thus, in some embodiments, the removal process of FIGS. 17A and 17B removes central portions of the first and second gate dielectric layers 120, 122 such that remaining portions of the first and second gate dielectric layers 120, 122 directly contact the trench isolation structure 104 along the yz-plane. In some embodiments, the removal process of FIGS. 17A and 17B may comprise a dry etching process conducted in the substantially z-direction. After the removal process of FIGS. 17A and 17B, the recess 1202 comprises some lower surfaces and outer sidewalls defined by the substrate 101 and/or regions of the substrate 101 such as the well region 102 and the lightly doped region 304.

In some embodiments, the trench isolation structure 104 is substantially resistant to removal by the removal process of FIGS. 17A and 17B. In some other embodiments, the first masking structure 1602 covers the entire trench isolation structure 104 and thus, the first masking structure 1602 prevents removal of the trench isolation structure by the removal process of FIGS. 17A and 17B.

Figure 17C:
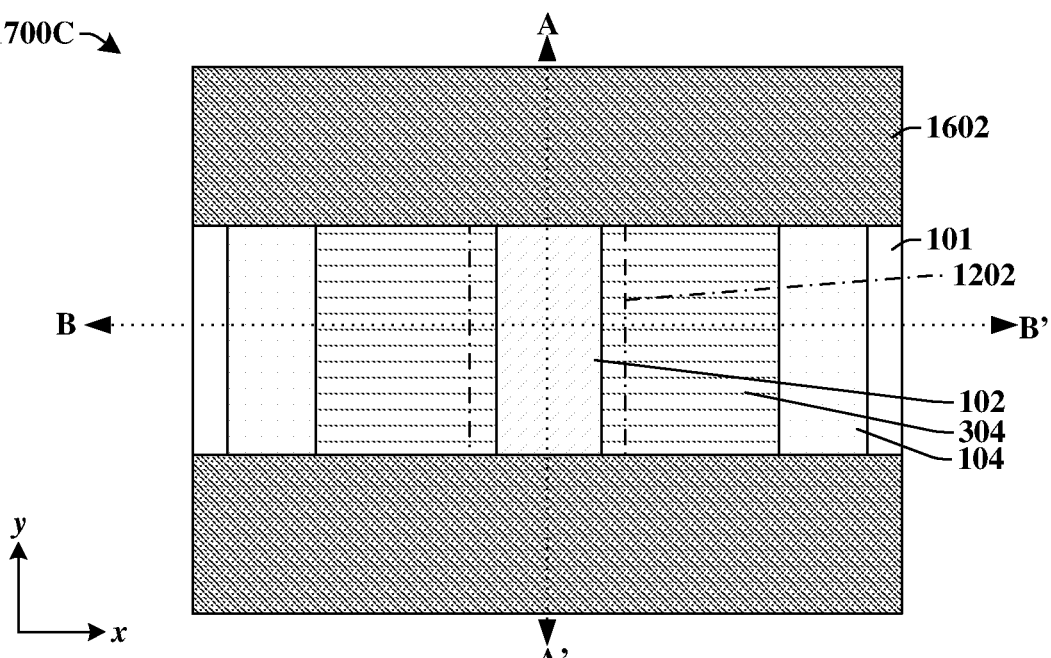

As shown in top-view 1700C of FIG. 17C, in some embodiments, the first and second gate dielectric layers (120, 122 of FIG. 17A) are not present because the first and second gate dielectric layers (120, 122 of FIG. 17A) are behind the first masking structure 1602. In some embodiments, the cross-sectional view 1700A of FIG. 17A corresponds to cross-section line AA' of FIG. 17C, and the cross-sectional view 1700B of FIG. 17B corresponds to cross-section line BB's of FIG. 17C.

Figure 18A:
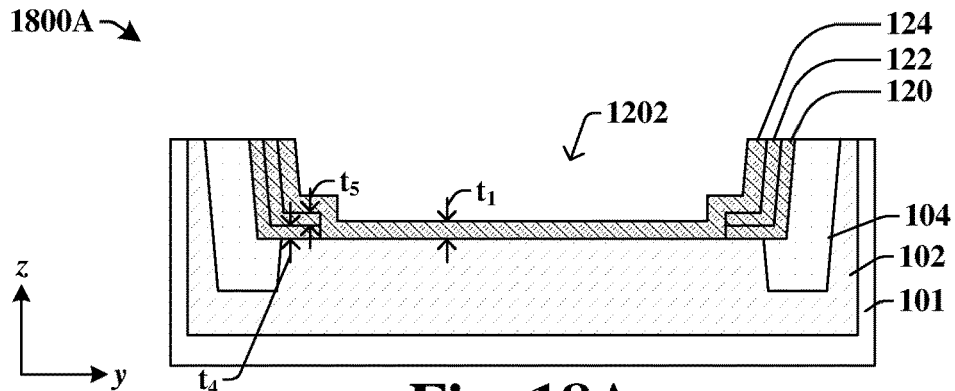
Figure 18B:
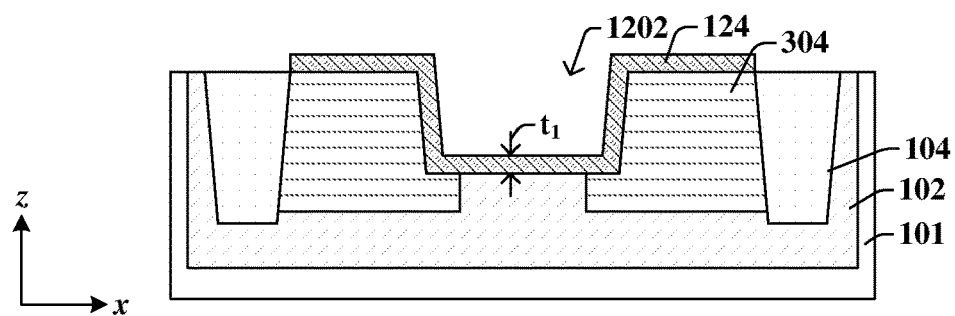

As shown in cross-sectional view 1800A of FIG. 18A and cross-sectional view 1800B of FIG. 18B, in some embodiments, the first masking structure (1602 of FIG. 16A) is removed, and a third gate dielectric layer 124 is formed over surfaces of the recess 1202 and over the second gate dielectric layer 122. In some embodiments, the third gate dielectric layer 124 may comprise a same material as the first and/or second gate dielectric layers 120, 122, whereas in some other embodiments, the third gate dielectric layer 124 may comprise a different material than the first and/or second gate dielectric layers 120, 122. In some embodiments, the third gate dielectric layer 124 may be formed by way of chemical vapor deposition (CVD) or by way of some other suitable deposition process (e.g., PVD, ALD, etc.). In some embodiments, the third gate dielectric layer 124 has a first thickness $t_1$ that is substantially uniform over the first gate dielectric layer 120. In some embodiments, the first thickness $t_1$ is in a range of between, for example, approximately 100 angstroms and approximately 300 angstroms.

Figure 18C:
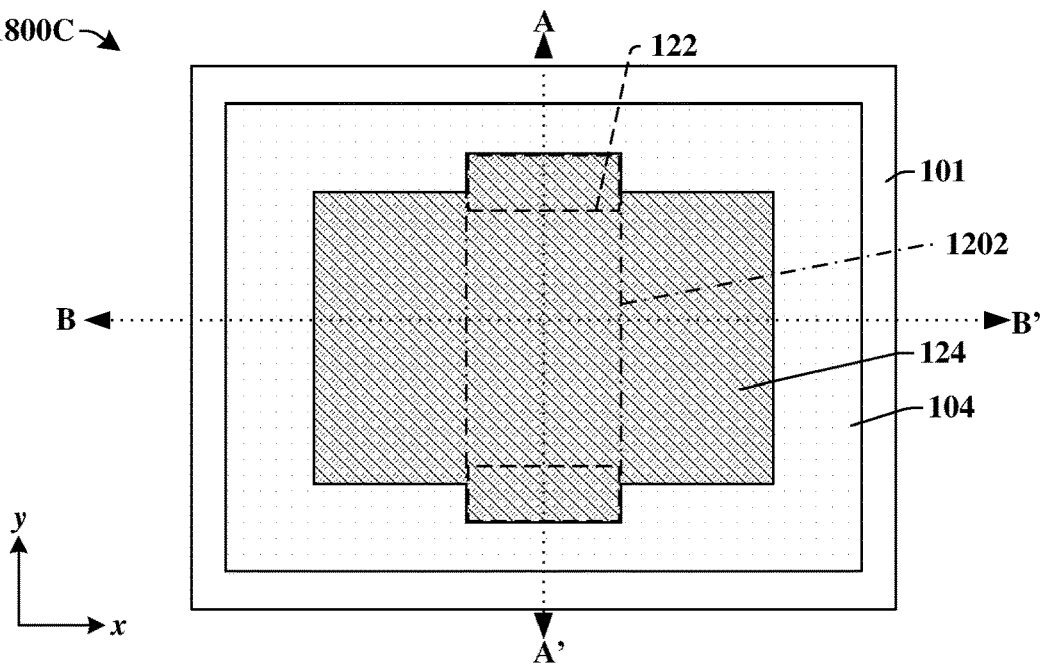

As shown in top-view 1800C of FIG. 18C, in some embodiments, the second gate dielectric layer 122 is illustrated with a hashed line to show that the second gate dielectric layer 122 is arranged under only certain portions of the third gate dielectric layer 124. In some embodiments, the cross-sectional view 1800A of FIG. 18A corresponds to cross-section line AA' of FIG. 18C, and the cross-sectional view 1800B of FIG. 18B corresponds to cross-section line BB's of FIG. 18C.

Figure 19A:
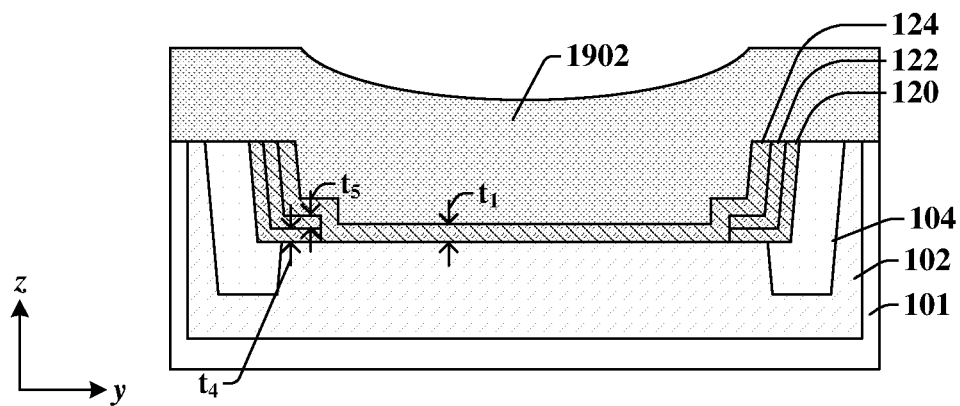
Figure 19B:
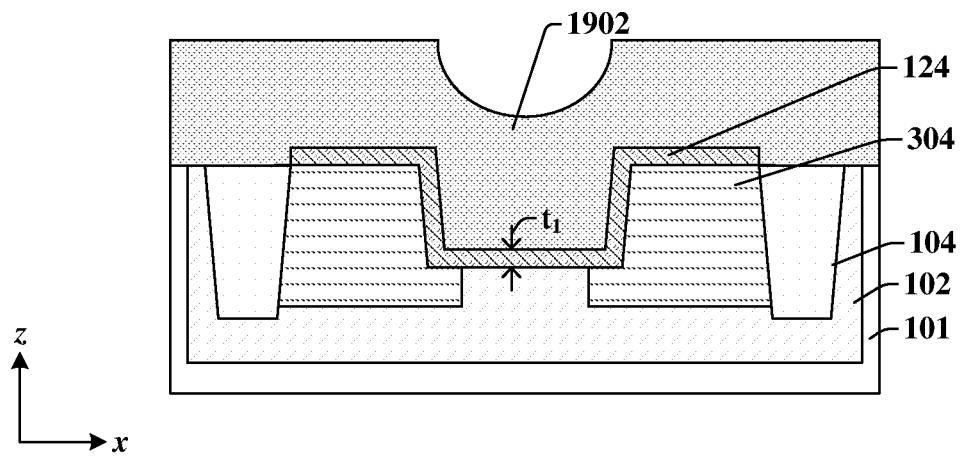

As shown in cross-sectional view 1900A of FIG. 19A and cross-sectional view 1900B of FIG. 19B, in some embodiments, a gate electrode material 1902 is then formed over the third gate dielectric layer 124 and fills the recess (1202 of FIGS. 18A and 18B) within the substrate 101. In some embodiments, the gate electrode material 1902 may be formed by way of a deposition process (e.g., CVD, PVD, ALD, sputtering, electroplating, etc.). In some embodiments, the gate electrode material 1902 may comprise polysilicon, aluminum, cobalt, ruthenium, or some other suitable conductive material.

Figure 20A:
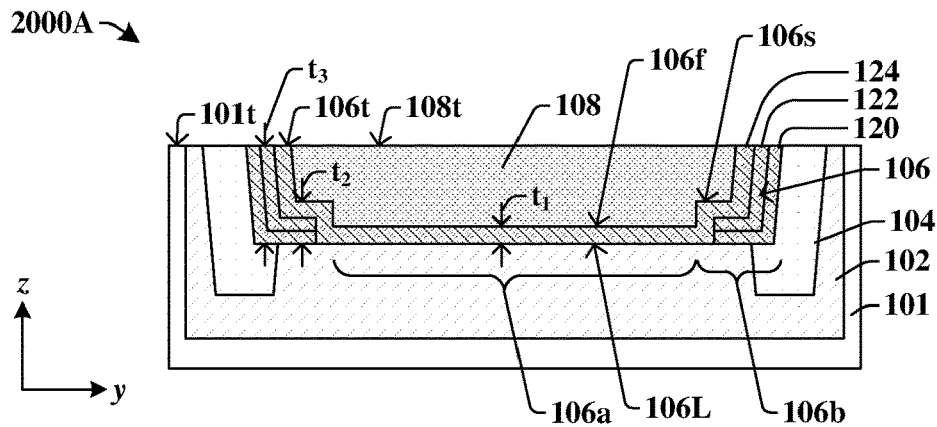
Figure 20B:
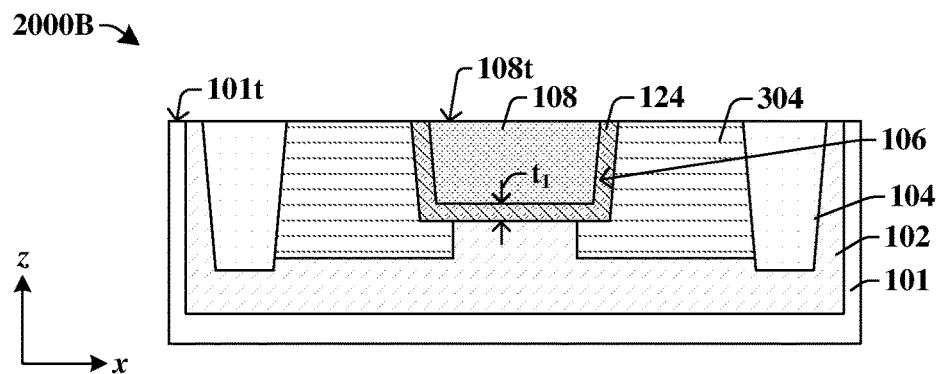

As shown in cross-sectional view 2000A of FIG. 20A and in cross-sectional view 2000B of FIG. 20B, in some embodiments, the gate electrode material (1902 of FIG. 19A) is planarized by a planarization process (e.g., chemical mechanical planarization (CMP)) to form a gate electrode 108 that has a topmost surface 108t that is substantially planar. Because the topmost surface 108t of the gate electrode 108 is substantially planar, subsequent deposited layers over the gate electrode 108 may also have substantially planar upper surfaces. In some embodiments, the gate electrode material (1902 of FIG. 19A) is planarized such that the topmost surface 108t of the gate electrode 108 is substantially planar with the topmost surface 101t of the substrate 101. In some other embodiments, the topmost surface 108t of the gate electrode 108 may undergo a planarization process (e.g., CMP) as well as a removal process (e.g., etching) such that the topmost surface 108t of the gate electrode 108 is arranged over the topmost surface 101t of the substrate 101. In some other embodiments (not shown), a work function layer may be formed within the recess (1202 of FIG. 18A) and above or below the gate electrode 108 to further tune a threshold voltage of the recessed MOSFET.

Further, in some embodiments, the planarization process (e.g., CMP) and/or some other removal process (e.g., etching) of FIGS. 20A and 20B may remove any portions of the first, second, and/or third gate dielectric layers 120, 122, 124 arranged over the topmost surface 101t of the substrate 101. After the planarization and/or removal processes of FIGS. 20A and 20B, the first, second, and third gate dielectric layers 120, 122, 124 make up a gate dielectric structure 106 surrounding the gate electrode 108. From the cross-sectional view 2000A of FIG. 20A, the gate dielectric structure 106 comprises a central portion 106a that comprises only the third gate dielectric layer 124 and has the first thickness $t_1$. In some embodiments, the first thickness $t_1$ is measured from a bottommost surface 106L of the gate dielectric structure 106 to a first middle surface 106f of the gate dielectric structure 106, wherein the first middle surface 106f is between the bottommost surface 106L and a topmost surface 106t of the gate dielectric structure 106. In some embodiments, from the cross-sectional view 2000B of FIG. 20B, the gate dielectric structure 106 only comprises the third gate dielectric layer 124, and thus, has the first thickness $t_1$.

Further, the gate dielectric structure 106 comprises a corner portion 106b that surrounds the central portion 106a and directly overlies the trench isolation structure 104. The corner portion 106b of the gate dielectric structure 106 has a second thickness $t_2$ that is equal to a sum of the thicknesses ($t_4$, $t_5$, $t_1$) of the first, second, and third gate dielectric layers 120, 122, 124. In some embodiments, the second thickness $t_2$ is measured between the bottommost surface 106L of the gate dielectric structure 106 and a second middle surface 106s of the gate dielectric structure 106, wherein the second middle surface 106s of the gate dielectric structure 106 is between the first middle surface 106f and the topmost surface 106t of the gate dielectric structure 106. In some embodiments, the corner portion 106b also has a third thickness $t_3$ which may be defined as the height of the gate dielectric structure 106 and is measured from the bottommost surface 106L to the topmost surface 106t of the gate dielectric structure 106 in the z-direction. The first, second, and third thicknesses $t_1$, $t_2$, $t_3$ are all measured in the same z-direction. The second thickness $t_2$ is greater than the first thickness $t_1$ to ensure that a rate of current versus gate voltage is substantially constant to increase the reliability of the recessed MOSFET. In some embodiments, the second thickness $t_2$ is at least three times greater than the first thickness $t_1$ because in some embodiments, the first, second, and third gate dielectric layers 120, 122, 124 may each be at least 100 angstroms thick.

Figure 20C:
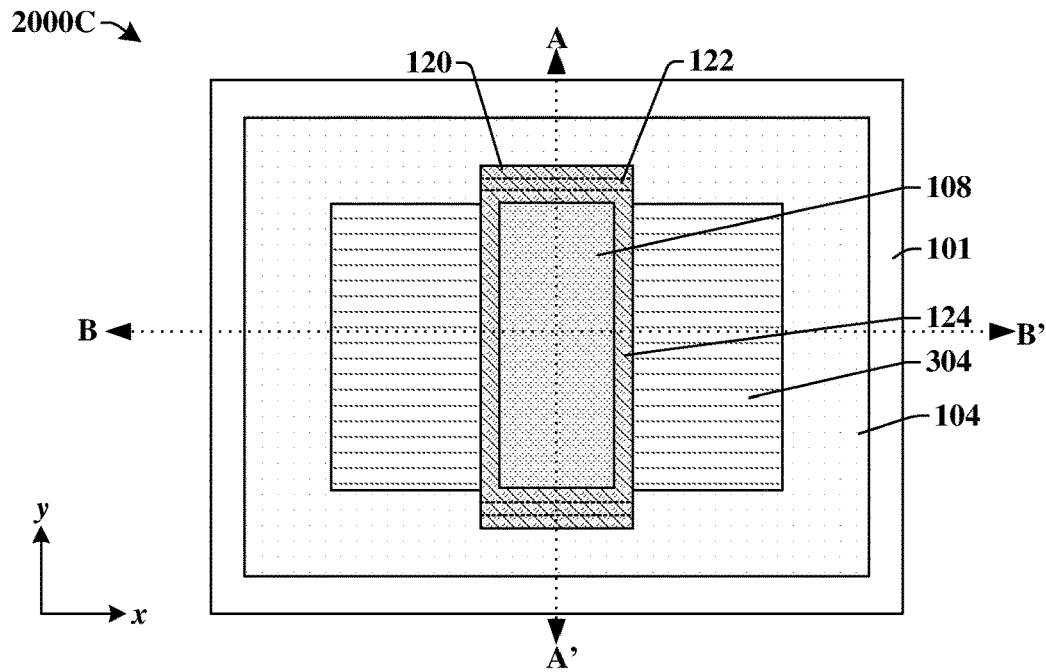

As shown in top-view 2000C of FIG. 20C, in some embodiments, the first, second, and third gate dielectric layers 120, 122, 124 are visible. In some embodiments, the first and second gate dielectric layers 120, 122 directly overlie the trench isolation structure 104. In some embodiments, the first and/or second gate dielectric layers 120, 122 also directly overlie and contact portions of the well region (102 of FIG. 20A). In some embodiments, the cross-sectional view 2000A of FIG. 20A corresponds to cross-section line AA' of FIG. 20C, and the cross-sectional view 2000B of FIG. 20B corresponds to cross-section line BB's of FIG. 20C.

Figure 21A:
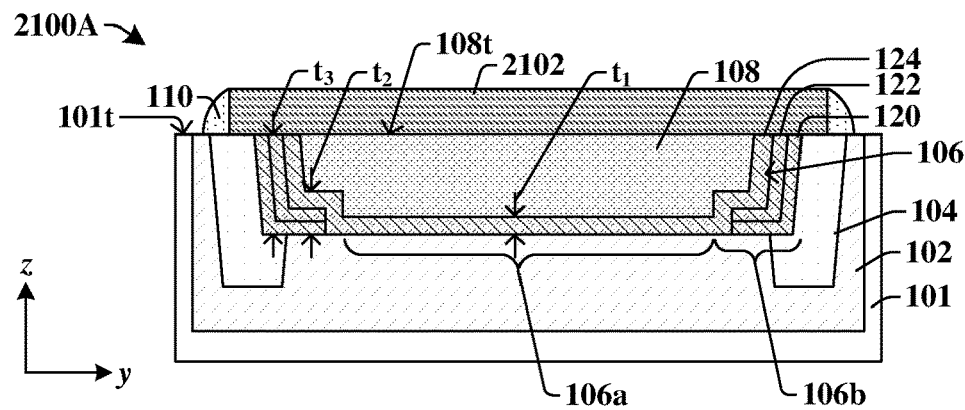
Figure 21B:
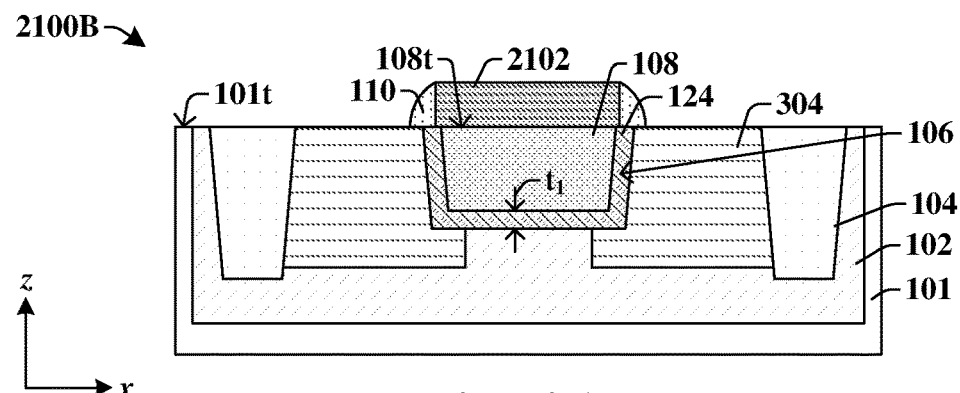
Figure 21C:
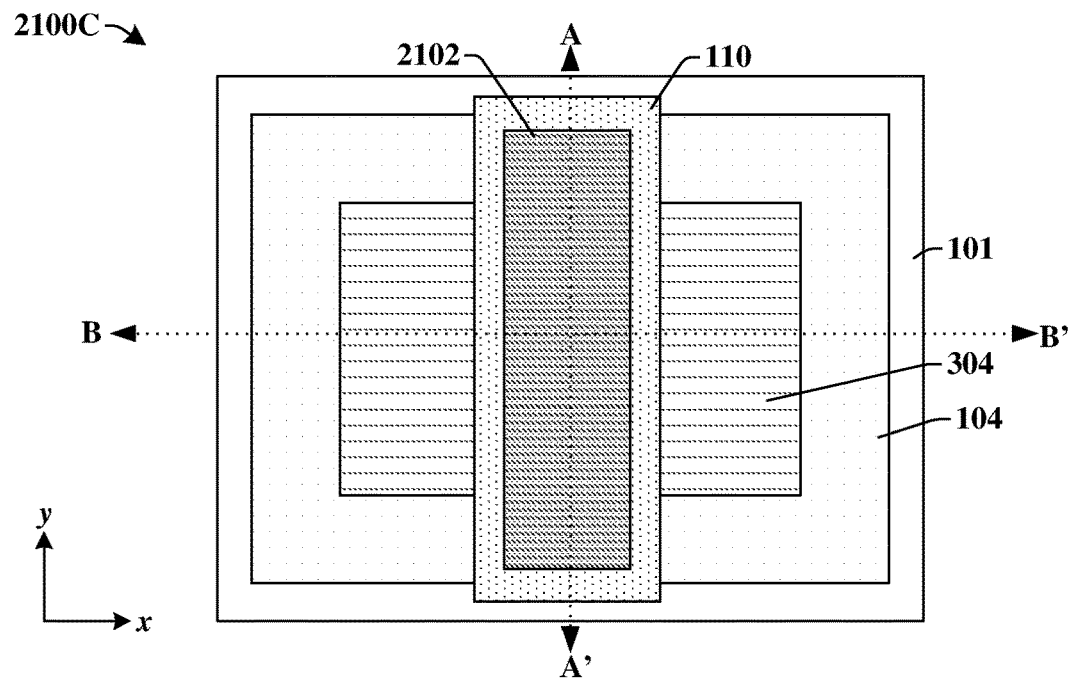

As shown in cross-sectional view 2100A of FIG. 21A, in cross-sectional view 2100B of FIG. 21B, and in the top-view 2100C of FIG. 21C, a hard mask layer 2102 may be formed over the gate electrode 108. In some embodiments, the hard mask layer 2102 may also directly overlie some or all of the gate dielectric structure 106. In some embodiments, the hard mask layer 2102 comprises a hard mask material such as, for example, silicon nitride, silicon carbide, or some other suitable hard mask material. In some embodiments, the hard mask layer 2102 is first deposited over the substrate 101 by way of a deposition process (e.g., CVD, PVD, ALD, etc.), and then is patterned by way of photolithography and removal (e.g., etching) processes.

Further, in some embodiments, a spacer structure 110 may be formed on outer sidewalls of the hard mask layer 2102. In some embodiments, the spacer structure 110 is formed by depositing a spacer layer over the hard mask layer 2102 and the substrate 101; then, a dry etching process may be performed to remove substantially horizontal portions of the spacer layer thereby forming the spacer structure 110. In some embodiments, the spacer structure 110 may comprise, for example, silicon dioxide, silicon nitride, some other suitable dielectric material, or a combination of the foregoing. In some embodiments, the spacer structure 110 has substantially curved outer sidewalls. Further, in some embodiments, the spacer structure 110 and the hard mask layer 2102 may together completely and directly overlie the gate electrode 108 and the gate dielectric structure 106.

In some other embodiments, the hard mask layer 2102 may be formed prior to performing a removal process of the gate electrode 108. For example, in some embodiments, the gate electrode material (1902 of FIG. 19A) may first undergo a planarization process (e.g., CMP), and then the hard mask layer 2102 may be formed over the planarized gate electrode material. Then, in some embodiments, an etching process according to the hard mask layer 2102 may be performed to remove outer portions of the planarized gate electrode, thereby forming the gate electrode 108. In such other embodiments, the gate electrode 108 may have a topmost surface 108t arranged above the topmost surface 101t of the substrate 101.

Figure 22A:
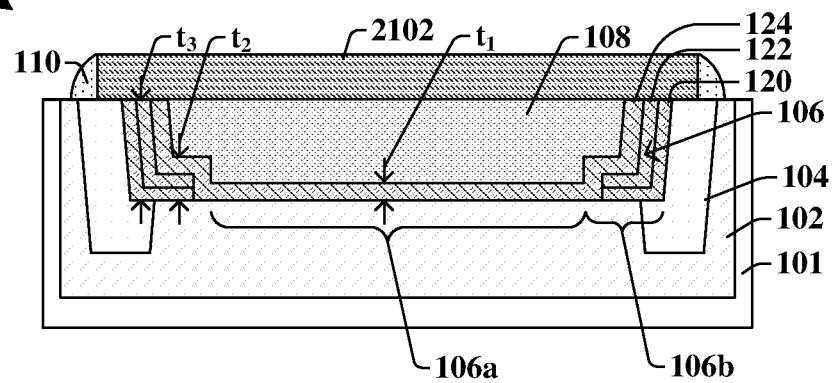
Figure 22B:
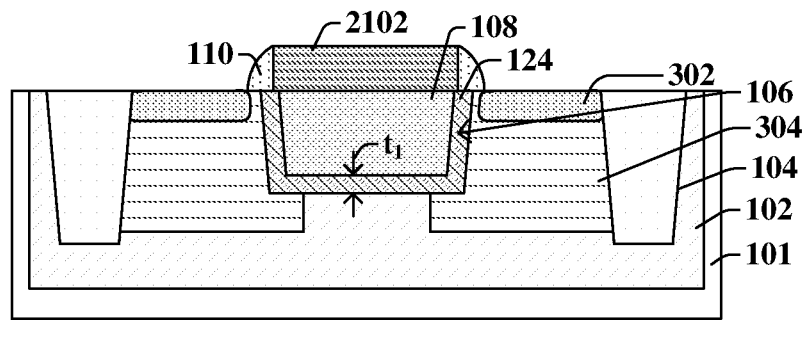

As shown in cross-sectional view 2200A of FIG. 22A and in cross-sectional view 2200B of FIG. 22B, in some embodiments, source/drain regions 302 may be formed laterally between the spacer structure 110 and the trench isolation structure 104. In some embodiments, the source/drain regions 302 are formed by way of ion implantation to dope portions of the lightly doped regions 304. The source/drain regions 302 may have a same doping type but a higher doping concentration than the lightly doped regions 304. The source/drain regions 302 may be formed by a self-aligned process wherein the hard mask layer 2102 and the spacer structure 110 act as a mask during the ion implantation process. The source/drain regions 302 are not visible from the cross-sectional view 2200A of FIG. 22A because there is no space between the spacer structure and the trench isolation structure 104 for the formation of the source/drain regions 302.

Figure 23A:
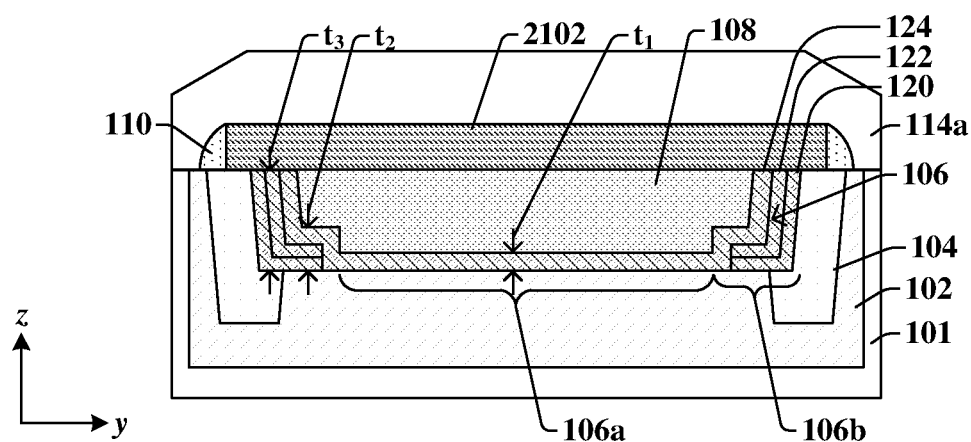
Figure 23B:
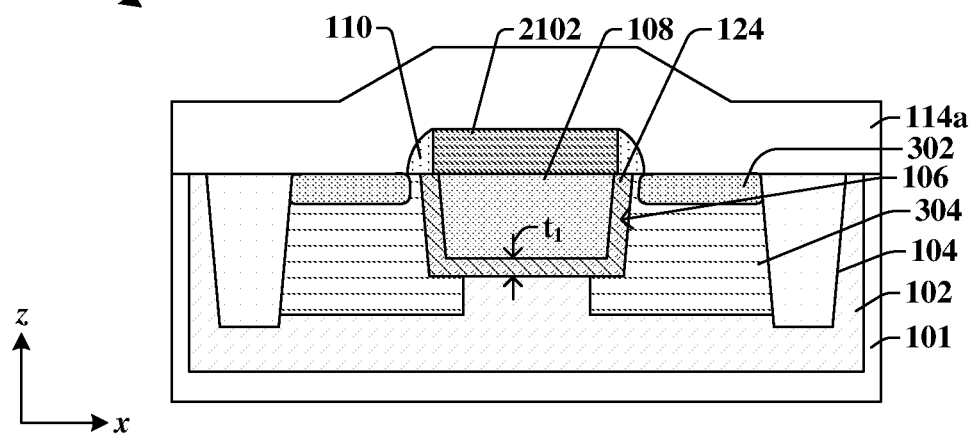

As shown in cross-sectional view 2300A of FIG. 23A and in cross-sectional view 2300B of FIG. 23B, in some embodiments, a first interconnect dielectric layer 114a is formed over the substrate 101 and the hard mask layer 2102. In some embodiments, the first interconnect dielectric layer 114a is formed by way of a deposition process (e.g., PVD, CVD, ALD, etc.), and may comprise, for example, a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like.

Figure 24A:
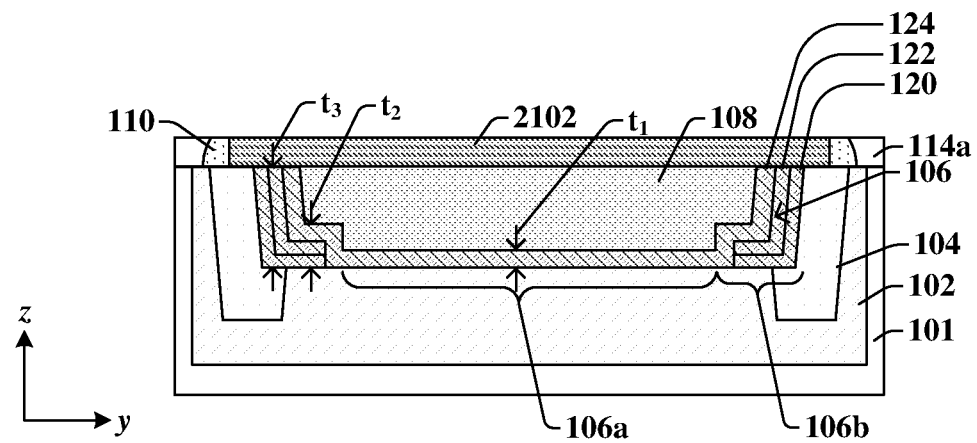
Figure 24B:
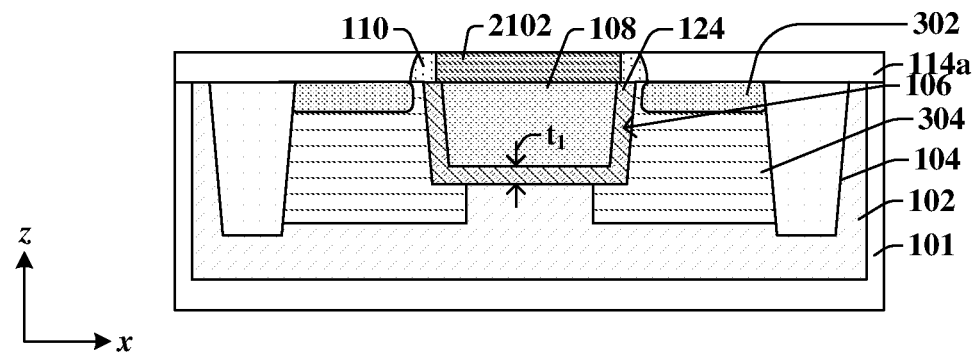

As shown in cross-sectional view 2400A of FIG. 24A and in cross-sectional view 2400B of FIG. 46B, in some embodiments, a planarization process (e.g., CMP) may be performed to remove portions of the first interconnect dielectric layer 114a arranged over the hard mask layer 2102. In some embodiments, the planarization process (e.g., CMP) may also remove upper portions of the spacer structure 110 and the hard mask layer 2102, such that the spacer structure 110 may have upper surfaces that are substantially planar. In some other embodiments, the planarization process (e.g., CMP) of FIGS. 24A and 24B does not remove portions of the spacer structure 110 and/or the hard mask layer 2102.

Figure 25A:
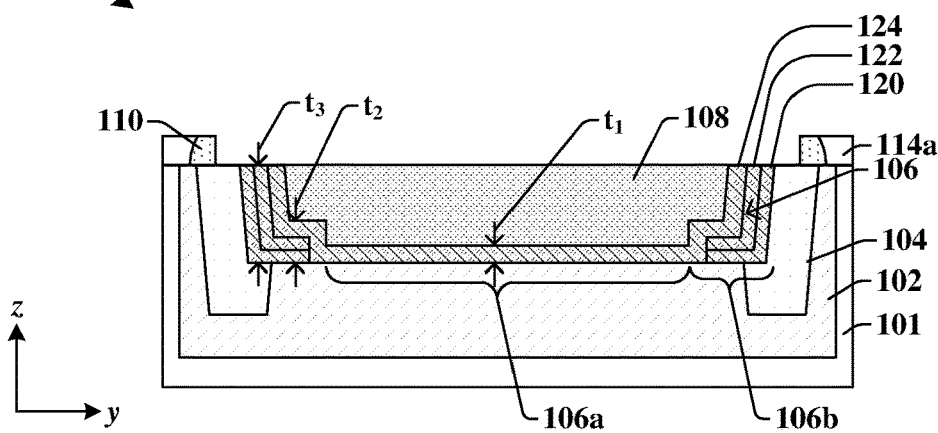
Figure 25B:
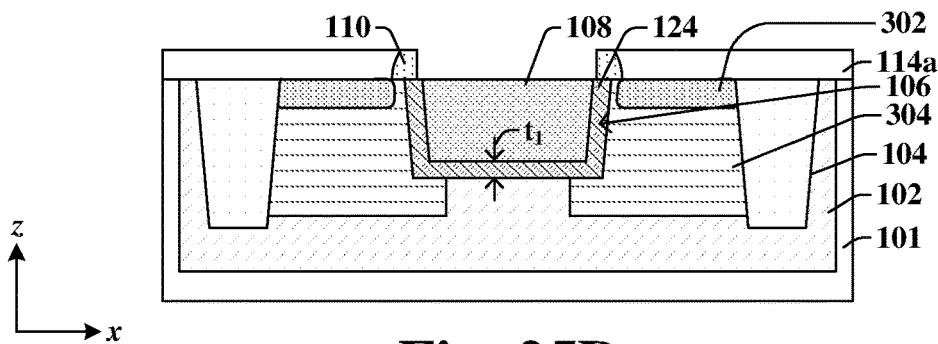
Figure 25C:
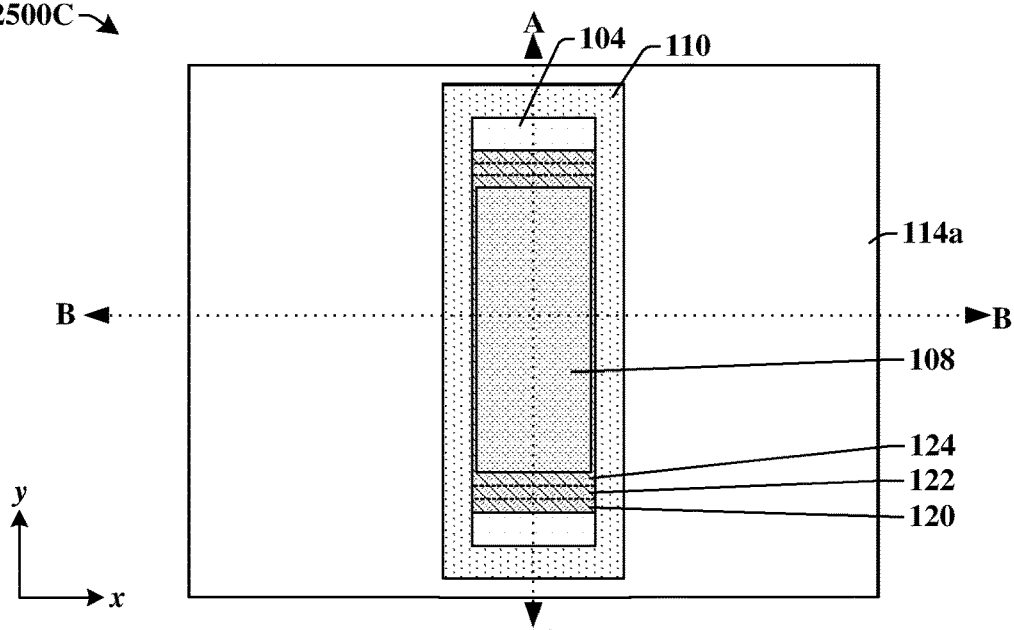

As shown in cross-sectional view 2500A of FIG. 25A, in cross-sectional view 2500B of FIG. 25B, and in top-view 2500C of FIG. 25C, in some embodiments, the hard mask layer (2102 of FIG. 24A) is selectively removed from the gate electrode 108. In some embodiments, the spacer structure 110 is not removed. In some embodiments, the hard mask layer (2102 of FIG. 24A) is removed by way of a wet or dry etch, and the gate electrode 108, the gate dielectric structure 106, and the trench isolation structure 104 may be substantially resistant to removal by the wet or dry etch.

In some embodiments (not shown), after the removal of the hard mask layer (2102 of FIG. 24A), a gate replacement process may be optionally performed. In such embodiments, the gate electrode 108 may be selectively removed from the gate dielectric structure 106 and a different gate electrode material may be formed within the gate dielectric structure 106. In some such embodiments, the gate electrode 108 formed in FIGS. 19A-C and FIGS. 20A-C may be termed as a "dummy gate electrode," and then the dummy gate electrode is removed and replaced in FIGS. 25A-C as the gate electrode 108. The gate replacement process may be used in some embodiments, for example, to reduce damage to the gate electrode 108 during various processing steps.

Figure 26A:
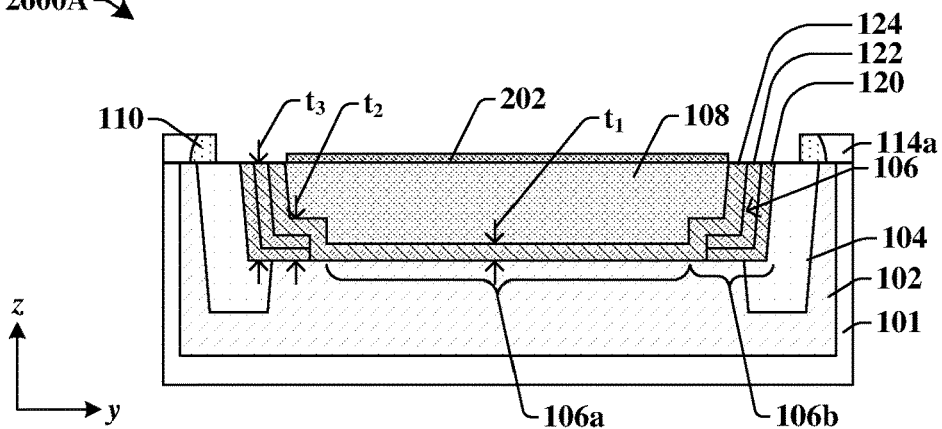
Figure 26B:
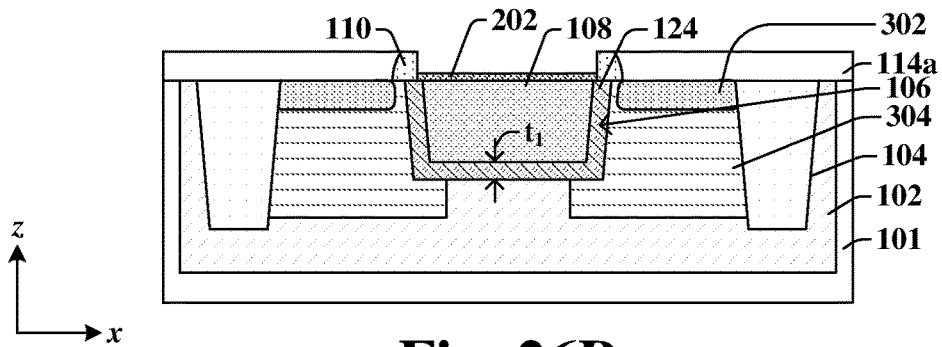
Figure 26C:
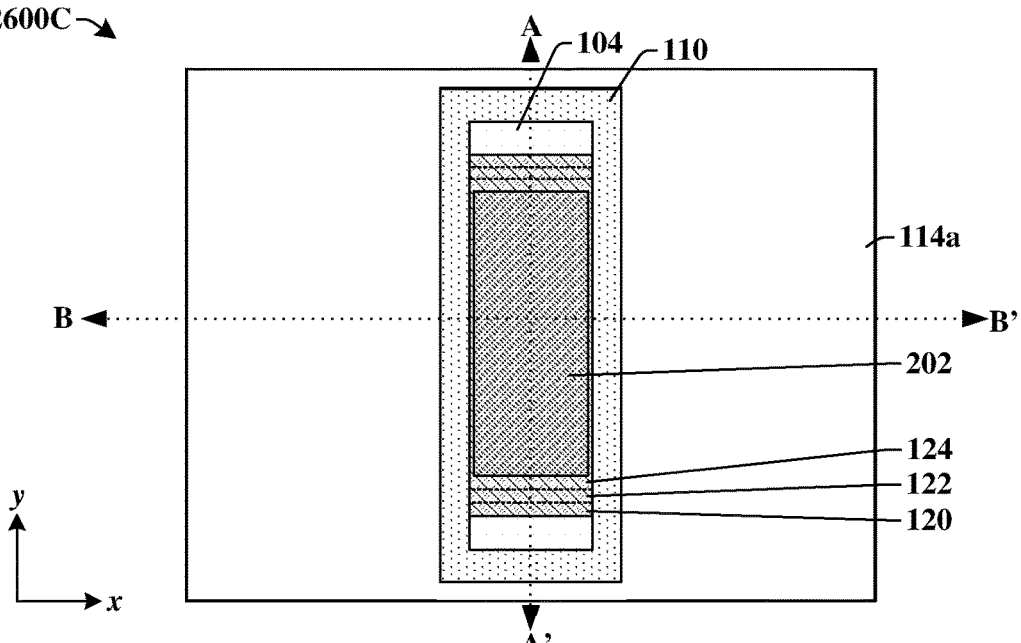

As shown in cross-sectional view 2600A of FIG. 26A, in cross-sectional view 2600B of FIG. 26B, and in top-view 2600C of FIG. 26C, in some embodiments, a silicide layer 202 is formed on the gate electrode 108. In some embodiments, the silicide layer 202 is formed when the gate electrode 108 comprises polysilicon. In some such embodiments, the silicide layer 202 may comprise, for example, cobalt silicide, titanium silicide, nickel silicide, or some other suitable metallic silicide material. In some embodiments, the silicide layer 202 is formed by depositing a transition metal layer covering the gate electrode 108 and subsequently heating the transition metal layer so it reacts with the polysilicon of the gate electrode 108. In some embodiments, the silicide layer 202 helps conductive features that will be formed over the gate electrode 108 to couple to the gate electrode 108.

Figure 27A:
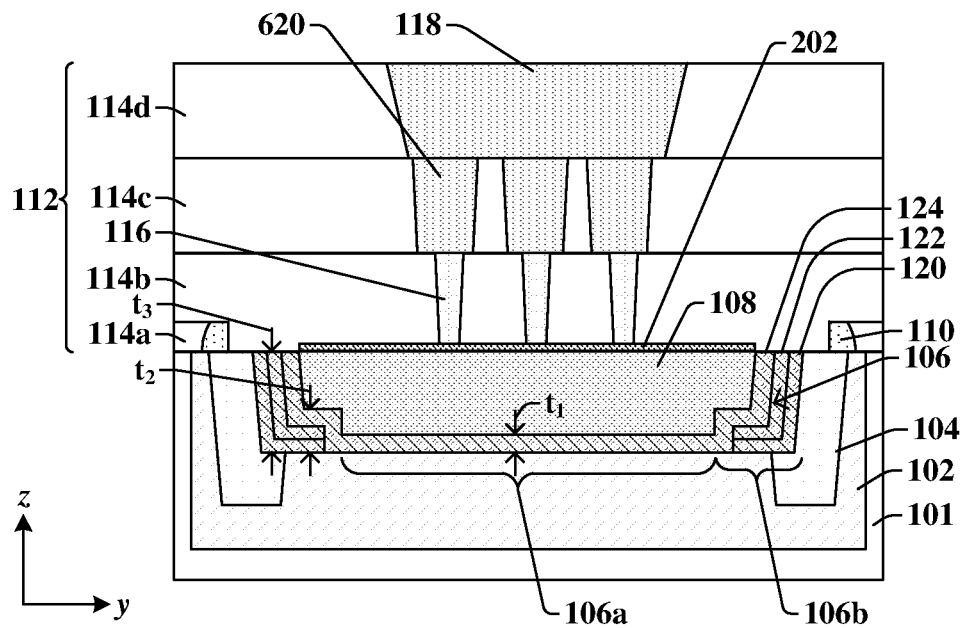
Figure 27B:
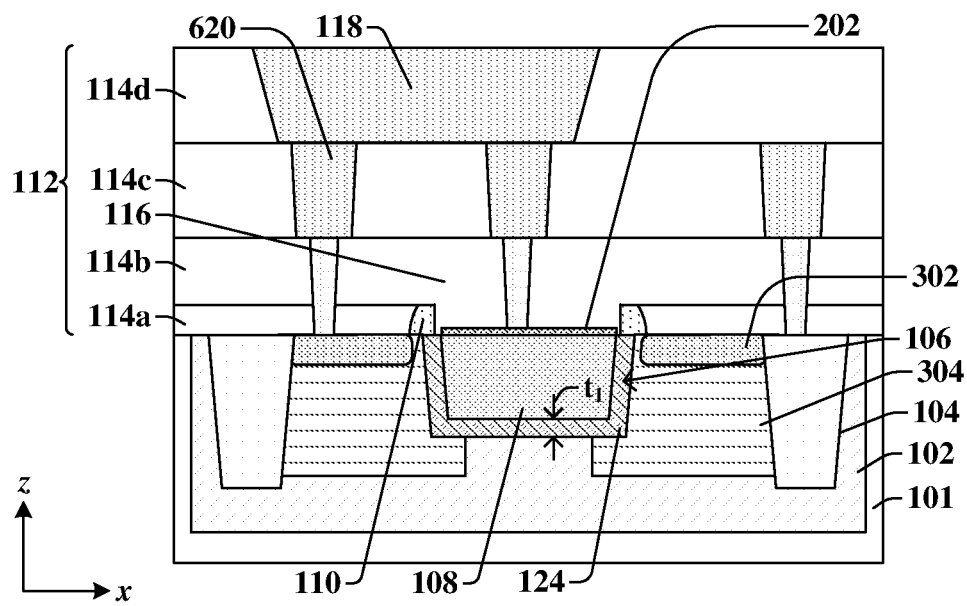

As shown in cross-sectional view 2700A of FIG. 27A and in cross-sectional view 2700B of FIG. 27B, in some embodiments, an interconnect structure 112 is formed over the gate electrode 108 and the source/drain regions 302 such that the recessed MOSFET may be coupled to more devices (e.g., a memory device, another transistor, an image sensor, etc.) arranged over the substrate 101. In some embodiments, the interconnect structure 112 comprises contact vias 116, interconnect wires 118, and an interconnect vias 620 arranged in first, second, third, and/or fourth interconnect dielectric layers 114a, 114b, 114c, 114d. In some embodiments, the first, second, and/or fourth interconnect dielectric layers 114a, 114b, 114c, 114d may comprise a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like. Further, in some embodiments, the contact vias 116, the interconnect wires 118, and the interconnect vias 620 may each comprise, for example, copper, tungsten, aluminum, titanium, tantalum, or some other suitable conductive material. In some embodiments, the interconnect structure 112 may be formed through various steps comprising deposition processes (e.g., PVD, CVD, ALD, sputtering, etc.), removal processes (e.g., wet etching, dry etching, CMP, etc.), and/or patterning processes (e.g., photolithography/etching).

Figure 28:
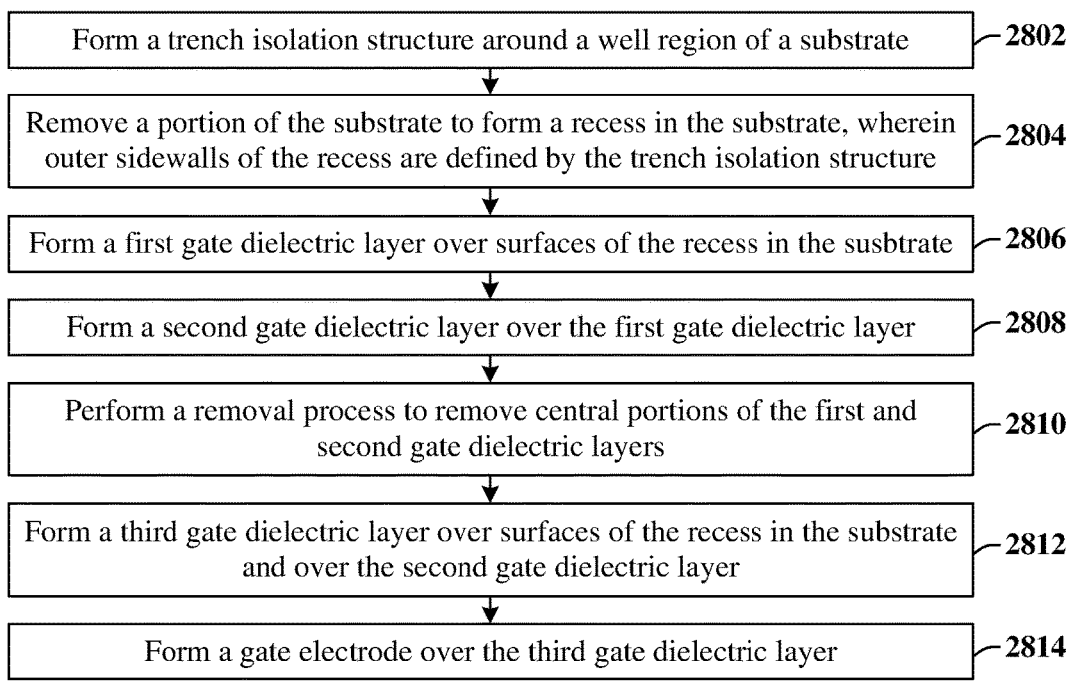
FIG. 28 illustrates a flow diagram of some embodiments of a method corresponding to the method illustrated in FIGS. 11A-11B through 27A-27B.

FIG. 28 illustrates a flow diagram of some embodiments of a method 2800 of forming a gate dielectric structure having a corner portion thicker than a central portion in a recessed MOSFET.

While method 2800 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 2802, a trench isolation structure is formed around a well region of a substrate. FIG. 11A illustrates cross-sectional view 1100A of some embodiments corresponding to act 2802.

At act 2804, a portion of the substrate is removed to form a recess in the substrate, wherein outer sidewalls of the recess are defined by the trench isolation structure. FIG. 12A illustrates cross-sectional view 1200A of some embodiments corresponding to act 2804.

At act 2806, a first gate dielectric layer is formed over surfaces of the recess in the substrate. FIG. 14A illustrates cross-sectional view 1400A of some embodiments corresponding to act 2806.

At act 2808, a second gate dielectric layer is formed over the first gate dielectric layer. FIG. 15A illustrates cross-sectional view 1500A of some embodiments corresponding to act 2808.

At act 2810, a removal process is performed to remove central portions of the first and second gate dielectric layers. FIG. 17A illustrates cross-sectional view 1700A of some embodiments corresponding to act 2810.

At act 2812, a third gate dielectric layer is formed over surfaces of the recess in the substrate and over the second gate dielectric layer. FIG. 18A illustrates cross-sectional view 1800A of some embodiments corresponding to act 2812.

At act 2814, a gate electrode is formed over the third gate dielectric layer. FIG. 20A illustrates a cross-sectional view 2000A of some embodiments corresponding to act 2814.

Therefore, the present disclosure relates to a method of increasing a thickness of a gate dielectric structure at a corner portion of the gate dielectric structure in a recessed MOSFET to improve the reliability of the recessed MOSFET.

Accordingly, in some embodiments, the present disclosure relates to a semiconductor device comprising: a well region within a substrate; a source region and a drain region arranged within the substrate on opposite sides of the well region; a gate electrode arranged over the well region, comprising a bottom surface arranged below a topmost surface of the substrate, and extending between the source region and the drain region; a trench isolation structure surrounding the source region, the drain region, and the gate electrode; and a gate dielectric structure separating the gate electrode from the well region, the source region, the drain region, and the trench isolation structure, wherein the gate dielectric structure comprises a central portion having a first thickness and a corner portion having a second thickness, and wherein the second thickness is greater than the first thickness.

In other embodiments, the present disclosure relates to a semiconductor device comprising: a well region within a substrate; a source region and a drain region arranged within the substrate on opposite sides of the well region; a gate electrode arranged within the substrate and directly between the source region and the drain region; a trench isolation structure continuously surrounding the source region, the drain region, and the gate electrode; and a gate dielectric structure arranged on outer sidewalls and bottom surfaces of the gate electrode, wherein the gate dielectric structure comprises a central portion having a first thickness, an inner corner portion having a second thickness that is greater than the first thickness, and an outer corner portion that has a third thickness greater than the second thickness, and wherein the first, second, and third thicknesses are measured in a same direction from a bottommost surface of the gate dielectric structure.

In yet other embodiments, the present disclosure relates to a method comprising: forming a trench isolation structure around a well region of a substrate; removing a portion of the substrate to form a recess in the substrate, wherein outer sidewalls of the recess are defined by the trench isolation structure; forming a first gate dielectric layer over surfaces of the recess in the substrate; forming a second gate dielectric layer over the first gate dielectric layer; performing a removal process to remove central portions of the first and second gate dielectric layers, wherein after the removal process, portions of the first and second gate dielectric layers remain on the trench isolation structure; forming a third gate dielectric layer over surfaces of the recess in the substrate and over the second gate dielectric layer; and forming a gate electrode over the third gate dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device comprising:
 a first doped region arranged within a semiconductor substrate, the first doped region having a first doping conductivity;

a second doped region and a third doped region arranged within the semiconductor substrate on opposite sides of the first doped region, the second doped region and third doped region spaced apart from one another in a first direction and having a second doping conductivity opposite the first doping conductivity;

a gate electrode arranged over the first doped region, the gate electrode comprising a bottom surface arranged below a topmost surface of the semiconductor substrate;

a trench isolation structure surrounding the second doped region, the third doped region, and the gate electrode; and a gate dielectric structure separating the gate electrode from the first doped region, wherein when viewed in cross-section along a second direction perpendicular to the first direction the gate dielectric structure comprises a central portion having a first thickness and a corner portion having a second thickness greater than the first thickness;

wherein the gate dielectric structure has a third thickness from an outer sidewall of the corner portion to an outer sidewall of the gate electrode, the third thickness being measured in the second direction;

wherein the third thickness is in a range between twenty percent and one percent of a distance between outermost sidewalls of the gate dielectric structure.

2. The semiconductor device of claim 1, wherein a topmost surface of the gate electrode is substantially coplanar with the topmost surface of the semiconductor substrate.

3. The semiconductor device of claim 1, wherein the gate dielectric structure comprises:
a first dielectric layer corresponding to the corner portion of the gate dielectric structure; and
a second dielectric layer in the central portion, the second dielectric layer having an end that directly contacts an end of the first dielectric layer.

4. The semiconductor device of claim 1, further comprising:
a sidewall spacer structure disposed along a sidewall of the gate electrode, wherein an uppermost surface of the sidewall spacer structure is higher than an uppermost surface of the gate electrode.

5. The semiconductor device of claim 4, further comprising:
a gate contact having tapered sidewalls extending between an upper surface of the gate contact and a lower surface of the gate contact, the lower surface of the gate contact contacting the uppermost surface of the gate electrode, wherein the lower surface of the gate contact is lower than the uppermost surface of the sidewall spacer structure.

6. A semiconductor device comprising:
a well region within a substrate;
a source region and a drain region arranged within the substrate on opposite sides of the well region;
a gate electrode arranged within the substrate and directly between the source region and the drain region;
a trench isolation structure continuously surrounding the source region, the drain region, and the gate electrode; and
a gate dielectric structure arranged on outer sidewalls and bottom surfaces of the gate electrode,
wherein the gate dielectric structure comprises a central portion having a first thickness, an inner corner portion having a second thickness that is greater than the first thickness, and an outer corner portion that has a third thickness greater than the second thickness;
wherein the gate electrode has discretely stepped sidewalls when viewed along a second plane, and a top surface of the gate electrode is substantially coplanar with a top surface of the substrate.

7. The semiconductor device of claim 6, wherein the second thickness is at least two times greater than the first thickness.

8. The semiconductor device of claim 6, further comprising:
a sidewall spacer structure disposed along a sidewall of the gate electrode, wherein an uppermost surface of the sidewall spacer structure is higher than an uppermost surface of the gate electrode.

9. The semiconductor device of claim 8, further comprising:
a silicide layer disposed over the gate electrode, wherein a bottom surface of the silicide layer contacts the uppermost surface of the gate electrode.

10. The semiconductor device of claim 9, further comprising:
a gate contact having tapered sidewalls extend between an upper surface of the gate contact and a lower surface of the gate contact, the lower surface of the gate contact contacting an uppermost surface of the silicide layer, wherein the lower surface of the gate contact is lower than the uppermost surface of the sidewall spacer structure.

11. The semiconductor device of claim 6, further comprising:
a second inner corner portion arranged between the central portion and the inner corner portion, wherein the second inner corner portion has a fourth thickness greater than the first thickness and second thickness.

12. The semiconductor device of claim 6, wherein when viewed along the second plane, the gate dielectric structure has a continuous flat bottom surface extending from directly under a first outermost edge of the gate electrode to directly under a second outermost edge of the gate electrode.

13. The semiconductor device of claim 12, wherein when viewed along the second plane, a central portion of the gate electrode is directly over the central portion of the gate dielectric structure and has a first flat bottom surface beneath which the gate dielectric structure has the first thickness.

14. The semiconductor device of claim 13, wherein when viewed along the second plane, an outer edge portion of the gate electrode is directly over the outer edge portion of the gate dielectric structure and has a second flat bottom surface beneath which the gate dielectric structure has the second thickness.

15. The semiconductor device of claim 14, wherein when viewed along the second plane, the first flat bottom surface of the gate electrode adjoins the second flat bottom surface of the gate electrode at a vertical sidewall.

16. A semiconductor device comprising:
a source region;
a drain region spaced apart from the source region along a channel length direction;
a well region disposed between the source region and the drain region;
a gate electrode arranged over the well region, the gate electrode comprising peripheral bottom surface regions that are arranged below a topmost surface of the source region and/or the drain region, and further comprising a central bottom surface region arranged between the peripheral bottom surface regions; and a gate dielectric structure separating the gate electrode from the well region, the gate dielectric structure having a first thickness under the central bottom surface region and having a second thickness under the peripheral bottom surface regions along a channel width direction, wherein the second thickness is greater than the first thickness and the channel width direction is perpendicular to the channel length direction;

wherein the peripheral bottom surface regions of the gate electrode are separated from the well region by peripheral regions of the gate dielectric structure having the second thickness.

17. The semiconductor device of claim 16, wherein the gate dielectric structure comprises three dielectric layers.

18. The semiconductor device of claim 17, wherein first and second gate dielectric layers of the three dielectric layers are arranged between a third gate dielectric layer of the three dielectric layers and the well region.

19. The semiconductor device of claim 17, wherein the peripheral regions of the gate dielectric structure under the peripheral bottom surface regions have the first thickness and includes each of the three dielectric layers, and a central region of the gate dielectric structure under the central bottom surface region has the second thickness and includes only one of the three dielectric layers.

20. The semiconductor device of claim 16, further comprising:

a trench isolation structure laterally surrounding the source region, the drain region, and the well region, wherein a bottom surface of the gate electrode is below an upper surface of the trench isolation structure.

\* \* \* \* \*